United States Patent
Ueno et al.

(10) Patent No.: US 7,466,003 B2
(45) Date of Patent: Dec. 16, 2008

(54) SOLID STATE IMAGE PICKUP DEVICE, CAMERA, AND DRIVING METHOD OF SOLID STATE IMAGE PICKUP DEVICE

(75) Inventors: Isamu Ueno, Hadano (JP); Toru Koizumi, Yokohama (JP); Akira Okita, Yamato (JP); Katsuhito Sakurai, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 382 days.

(21) Appl. No.: 11/328,108

(22) Filed: Jan. 10, 2006

(65) Prior Publication Data
US 2006/0158543 A1 Jul. 20, 2006

(30) Foreign Application Priority Data
Jan. 14, 2005 (JP) ............................. 2005-008181

(51) Int. Cl.
*H01L 31/06* (2006.01)
(52) U.S. Cl. .............................. 257/462; 257/E27.133; 257/E31.128
(58) Field of Classification Search ................. 257/462, 257/E27.133, E31.128
See application file for complete search history.

(56) References Cited

U.S. PATENT DOCUMENTS

| | | | |
|---|---|---|---|
| 5,698,892 A | 12/1997 | Koizumi et al. ............. | 257/620 |
| 6,064,431 A | 5/2000 | Ueno ......................... | 348/241 |
| 6,188,094 B1 | 2/2001 | Kochi et al. ................ | 257/232 |
| 6,307,195 B1 | 10/2001 | Guidash .................... | 250/208.1 |
| 6,317,154 B2 * | 11/2001 | Beiley ........................ | 348/308 |
| 6,342,920 B2 | 1/2002 | Ueno ......................... | 348/303 |
| 6,605,850 B1 | 8/2003 | Kochi et al. ................. | 257/431 |
| 6,670,990 B1 | 12/2003 | Kochi et al. ................. | 348/310 |
| 6,850,278 B1 | 2/2005 | Sakurai et al. | |
| 6,946,637 B2 | 9/2005 | Kochi et al. ............... | 250/208.1 |
| 6,960,751 B2 | 11/2005 | Hiyama et al. ........... | 250/208.1 |
| 6,974,975 B2 | 12/2005 | Shizukuishi ................. | 257/98 |
| 7,016,089 B2 | 3/2006 | Yoneda et al. .............. | 358/482 |
| 7,110,030 B1 | 9/2006 | Kochi et al. ................. | 348/308 |
| 7,187,052 B2 | 3/2007 | Okita et al. ................. | 257/444 |
| 2001/0002848 A1 | 6/2001 | Fossum et al. | |
| 2003/0164887 A1 | 9/2003 | Koizumi et al. ............. | 348/308 |

(Continued)

FOREIGN PATENT DOCUMENTS

EP    0 275 217 A2    7/1988

(Continued)

OTHER PUBLICATIONS

European Search Report dated Dec. 3, 2003, issued in counterpart application No. 06 100 268.9-2202.

(Continued)

*Primary Examiner*—Howard Weiss
(74) *Attorney, Agent, or Firm*—Fitzpatrick, Cella, Harper & Scinto

(57) ABSTRACT

A solid state image pickup device that can properly widen a dynamic range is provided. Carriers that have overflowed from photodiodes (1003a to 1003c) to lateral overflow regions (1010a to 1010c) and carriers accumulated in the photodiodes (1003a and 1003b) are transferred to FD regions (1005a to 1005c). Signals based on those carriers are added and held in a signal level holding capacitor (Cs) and read out therefrom, thereby widening the dynamic range.

11 Claims, 14 Drawing Sheets

U.S. PATENT DOCUMENTS

| | | |
|---|---|---|
| 2004/0065808 A1 | 4/2004 | Kochi et al. ............. 250/214.1 |
| 2005/0122418 A1 | 6/2005 | Okita et al. ................ 348/340 |
| 2005/0139845 A1 | 6/2005 | Shizukuishi ................. 257/98 |
| 2005/0168618 A1 | 8/2005 | Okita et al. ................ 348/335 |
| 2005/0174552 A1 | 8/2005 | Takada et al. ................ 355/53 |
| 2005/0179796 A1 | 8/2005 | Okita et al. ................ 348/308 |
| 2005/0185074 A1 | 8/2005 | Yoneda et al. ............. 348/294 |
| 2005/0268960 A1 | 12/2005 | Hiyama et al. ............. 136/244 |
| 2005/0269604 A1 | 12/2005 | Koizumi et al. ............ 257/291 |
| 2006/0027843 A1 | 2/2006 | Ogura et al. ................ 257/291 |
| 2006/0043261 A1 | 3/2006 | Matsuda et al. .......... 250/208.1 |
| 2006/0043393 A1 | 3/2006 | Okita et al. ................... 257/93 |
| 2006/0043439 A1 | 3/2006 | Koizumi .................... 257/291 |
| 2006/0044434 A1 | 3/2006 | Okita et al. ................ 348/294 |
| 2006/0157759 A1 | 7/2006 | Okita et al. ................ 257/292 |
| 2006/0158539 A1 | 7/2006 | Koizumi et al. ............. 348/300 |
| 2006/0208161 A1 | 9/2006 | Okita et al. .............. 250/208.1 |
| 2006/0208291 A1 | 9/2006 | Koizumi et al. ............. 257/292 |
| 2006/0208292 A1 | 9/2006 | Itano et al. .................. 257/292 |
| 2006/0221667 A1 | 10/2006 | Ogura et al. ................ 365/149 |

FOREIGN PATENT DOCUMENTS

| | | |
|---|---|---|
| EP | 1 096 790 A2 | 5/2001 |
| EP | 1 259 066 A2 | 11/2002 |
| EP | 1 608 023 A1 | 12/2005 |
| JP | 2000-165754 | 6/2000 |
| JP | 2001-186414 | 7/2001 |
| JP | 2004-335802 | 11/2004 |
| WO | WO 2004/079825 A1 | 9/2004 |

OTHER PUBLICATIONS

Decker, S. et al., "A 256×256 CMOS Imaging Array with Wide Dynamic Range Pixels and Column-Parallel Digital Output," IEEE Journal of Solid-State Circuits, Piscataway, NJ, Dec. 1998, vol. 33, No. 12, pp. 2081-2090.

* cited by examiner

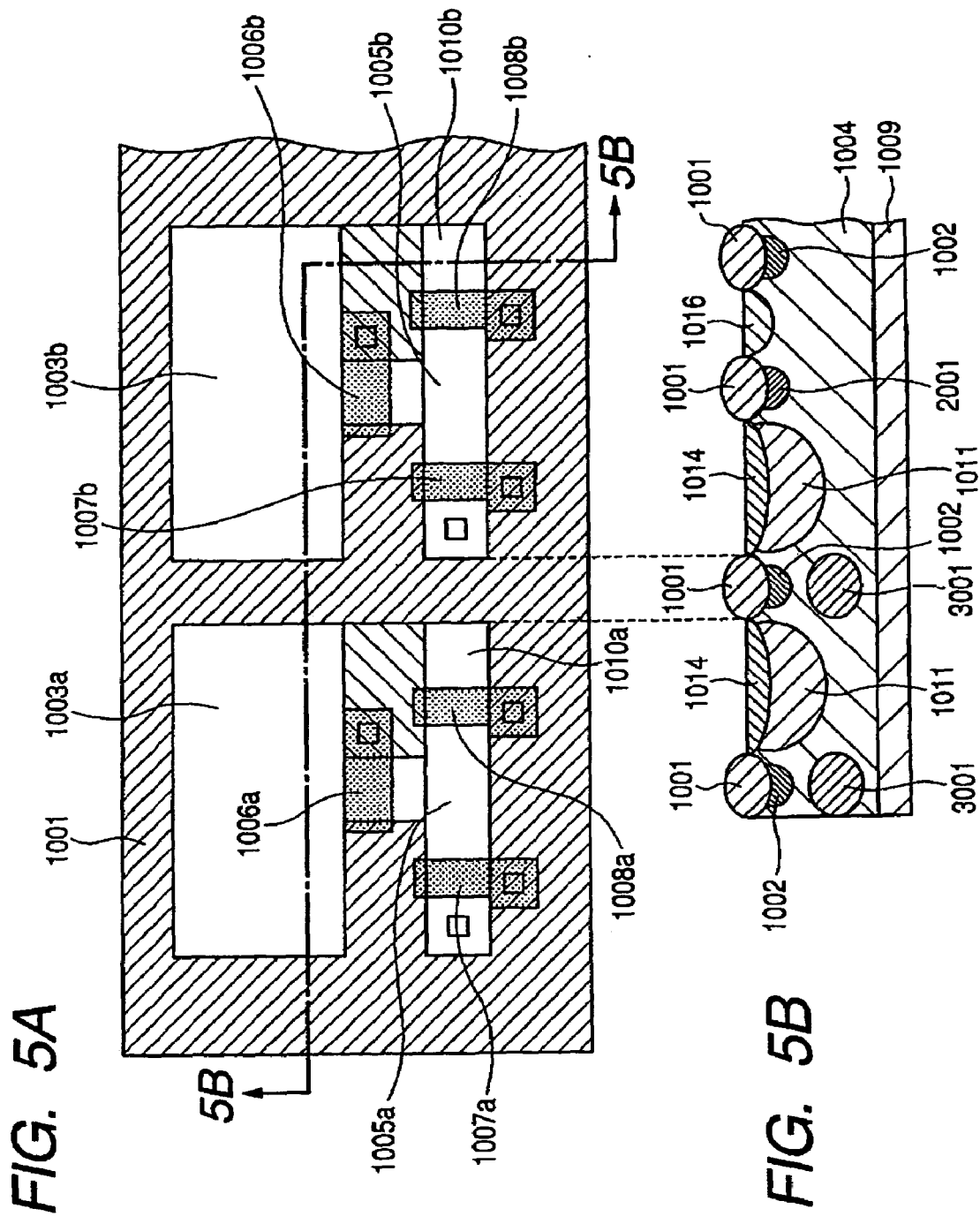

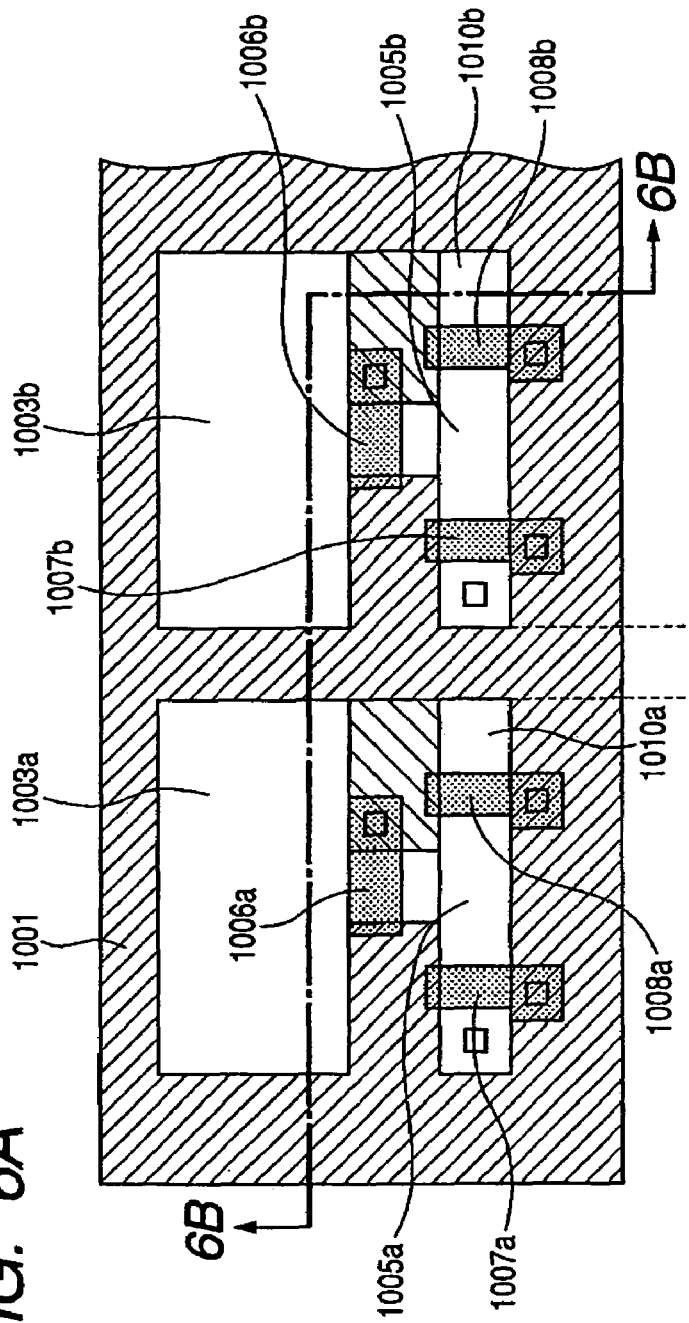
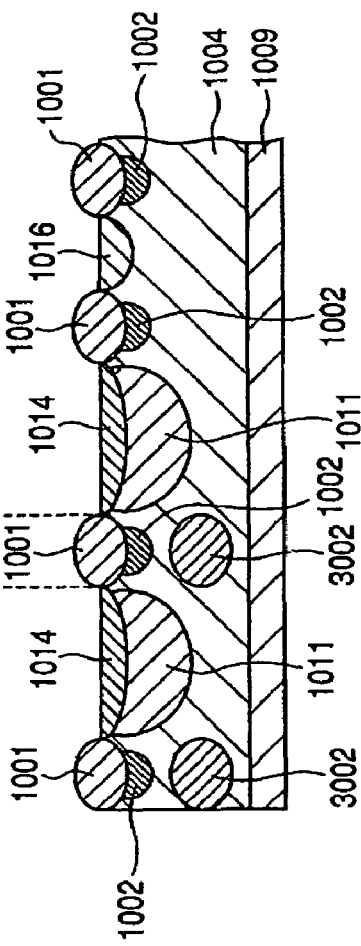
FIG. 6A
FIG. 6B

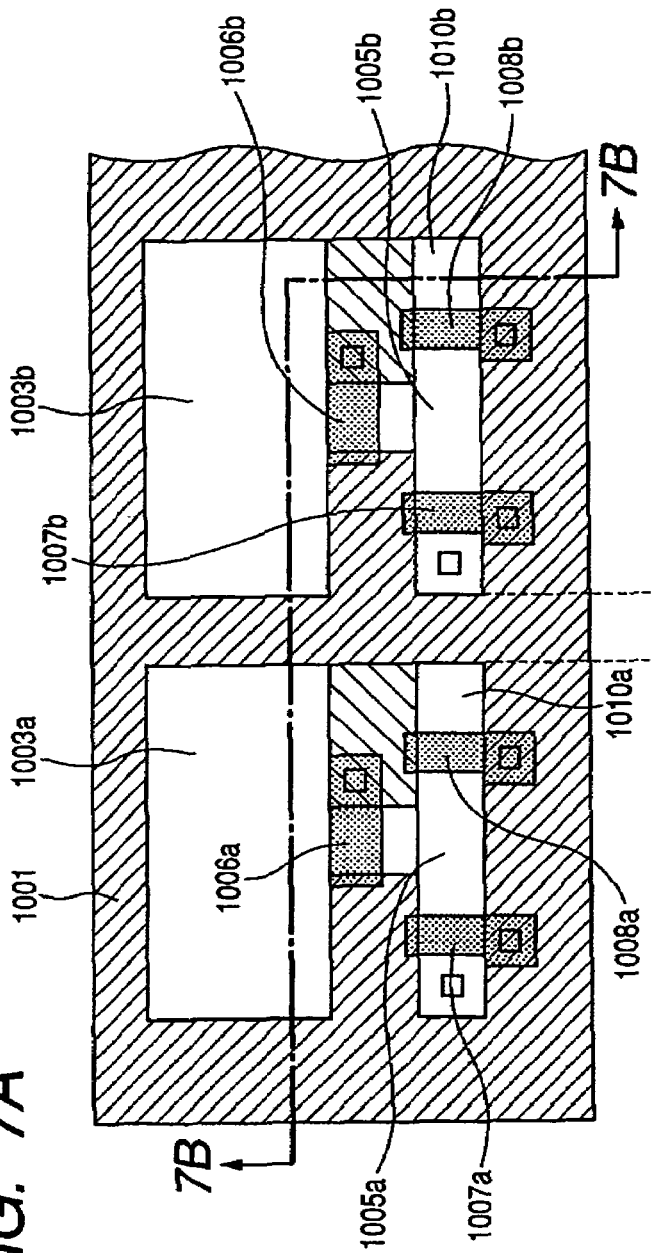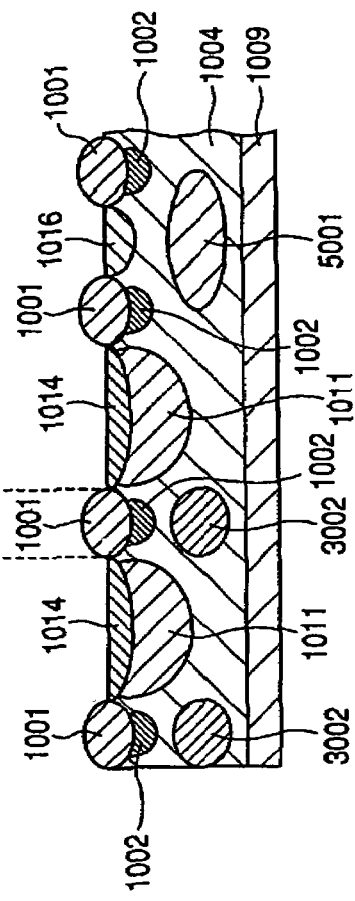
FIG. 7A
FIG. 7B

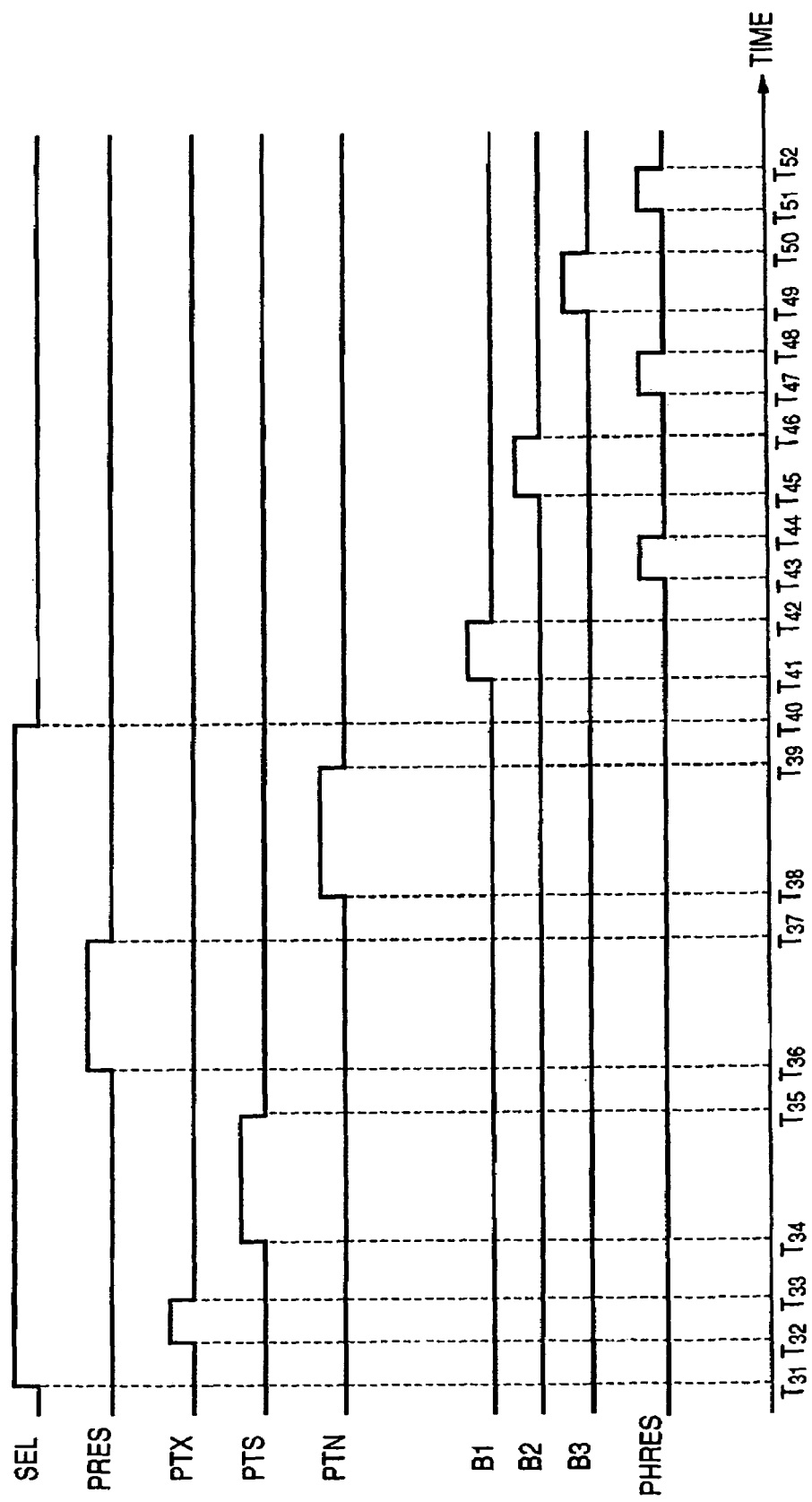

SOLID STATE IMAGE PICKUP DEVICE, CAMERA, AND DRIVING METHOD OF SOLID STATE IMAGE PICKUP DEVICE

BACKGROUND OF THE INVENTION

1. Field of the Invention

The invention relates to a solid state image pickup device, a camera, and a driving method of the solid state image pickup device and, more particularly, is suitable for use in a CMOS area sensor.

2. Related Background Art

In recent years, a CMOS area sensor in which a photodiode as a photoelectric conversion element and an MOS transistor as a switching element are formed as one chip is used as a solid state image pickup device. As compared with a CCD, the CMOS area sensor has such advantages that an electric power consumption is smaller, a driving power is smaller, a higher speed operation can be performed, and the like. Therefore, it is presumed that a demand for the CMOS area sensors will be increased in future.

A technique for widening a dynamic range of the solid state image pickup device by using such a CMOS area sensor has been proposed (refer to Japanese Patent Application Laid-Open No. 2001-186414 (corresponding U.S. Pat. No. 6,307, 195)).

The proposed CMOS area sensor is constructed by forming a plurality of pixels, in a matrix shape, each having: a photodiode; a floating diffusion (hereinafter, abbreviated to "FD" as necessary) region; a transfer transistor for transferring carriers from the photodiode to the FD region; and a resetting transistor for resetting the FD region to a predetermined electric potential.

In the CMOS area sensor, first, a signal based on the carriers accumulated in the photodiode is read out and, thereafter, a signal based on the carriers which have overflowed from the photodiode and have been accumulated in the FD region is read out. The read-out signals are outputted through an analog amplifier.

In Japanese Patent Application Laid-Open No. 2004-335802, there is disclosed an MOS type solid state image pickup device in which a plurality of photosensitive units are arranged in an array shape onto the surface of a semiconductor substrate and a signal of each of the photosensitive units is read out every photosensitive unit, wherein each of the photosensitive units comprises: a first signal carrier detecting unit for detecting a signal corresponding to an incident light amount; and a second signal carrier detecting unit for trapping a part of excessive carriers in the first signal carrier detecting unit when a detection signal by the first signal carrier detecting unit is saturated and detecting a signal corresponding to an amount of the trapped carriers.

According to Japanese Patent Laid-Open No. 2004-335802, as shown in FIG. 2 of this Official Gazette, it is characterized by comprising a second signal carrier detecting unit (38) for detecting a part of electrons generated in a first signal carrier detecting unit (31) when those electrons are saturated. It has a structure in which a part of excessive carriers are trapped and the residual excessive carriers are abandoned into a vertical overflow drain. It independently has the first and second signal carrier detecting units.

However, according to the foregoing conventional techniques, an amount of carriers which are accumulated in the FD region cannot be controlled. There is, consequently, a problem that it is difficult to properly widen the dynamic range of the CMOS area sensor.

The invention is made in consideration of such a problem and it is an object of the invention to provide a solid state image pickup device which can properly widen the dynamic range, its driving method, and a camera using the solid state image pickup device.

SUMMARY OF THE INVENTION

According to the invention, there is provided a solid state image pickup device including a plurality of pixels each having: photoelectric converting means; a first transfer switch for transferring carriers accumulated in the photoelectric converting means; a floating diffusion region into which the carriers accumulated in the photoelectric converting means flow through the first transfer switch; a lateral overflow drain region in which at least a part of the carriers which have overflowed from the photoelectric converting means can flow; and a second transfer switch for transferring the carriers which have flowed in the lateral overflow drain region to the floating diffusion region, wherein a potential barrier between the photoelectric converting means and the lateral overflow drain region is lower than that between the photoelectric converting means and a photoelectric converting means of the pixel adjacent to the photoelectric converting means.

According to another embodiment of the invention, there is provided a solid state image pickup device including a plurality of pixels each having: photoelectric converting means; a first transfer switch for transferring carriers accumulated in the photoelectric converting means; and a floating diffusion region into which the carriers accumulated in the photoelectric converting means can flow through the first transfer switch, wherein a potential barrier between the photoelectric converting means and the floating diffusion region is lower than that between the photoelectric converting means and a photoelectric converting means of the pixel adjacent to the photoelectric converting means.

According to the invention, there is provided a camera comprising: either of the above solid state image pickup devices; a lens for forming an optical image onto the solid state image pickup device; and a diaphragm for making an amount of light passing through the lens variable.

According to the invention, there is provided a driving method of a solid state image pickup device including a plurality of pixels each having photoelectric converting means, a lateral overflow drain region in which at least a part of carriers which have overflowed from the photoelectric converting means can flow, and a floating diffusion region in which the carriers accumulated in the photoelectric converting means and the carriers from the lateral overflow drain region flow, in which a potential barrier between the photoelectric converting means and the lateral overflow drain region is lower than that between the photoelectric converting means and a photoelectric converting means of the pixel adjacent to the photoelectric converting means, comprising: a resetting step of resetting an electric potential of the floating diffusion region; a resetting level holding step of holding a signal based on the electric potential of the floating diffusion region reset in the resetting step; a first transfer step of transferring the carriers accumulated in the photoelectric converting means to the floating diffusion region; a second transfer step of transferring the carriers which have flowed in the lateral overflow drain region to the floating diffusion region; and a signal level holding step of holding the carriers transferred to the floating diffusion region in the first transfer step and the second transfer step.

According to another embodiment of the invention, there is provided a driving method of a solid state image pickup device including a plurality of pixels each having photoelectric converting means and a floating diffusion region in which carriers accumulated in the photoelectric converting means flow, in which a potential barrier between the photoelectric converting means and the floating diffusion region is lower than that between the photoelectric converting means and a photoelectric converting means of the pixel adjacent to the photoelectric converting means, comprising:

a transfer step of transferring at least a part of the carriers photoelectrically converted by the photoelectric converting means to the floating diffusion region; a signal level holding step of holding the carriers transferred to the floating diffusion region in the transfer step; a resetting step of resetting an electric potential of the floating diffusion region; and a resetting level holding step of holding a signal based on the electric potential of the floating diffusion region reset in the resetting step.

According to still another embodiment of the invention, there is provided a driving method of a solid state image pickup device including a plurality of pixels each having photoelectric converting means, a lateral overflow drain region in which at least a part of carriers which have overflowed from the photoelectric converting means can flow, and a floating diffusion region in which the carriers accumulated in the photoelectric converting means and the carriers from the lateral overflow drain region flow, in which a potential barrier between the photoelectric converting means and the lateral overflow drain region is lower than that between the photoelectric converting means and a photoelectric converting means of the pixel adjacent to the photoelectric converting means, comprising: a first transfer step of transferring the carriers which have flowed in the lateral overflow drain region to the floating diffusion region; a first signal level holding step of holding the carriers transferred to the floating diffusion region in the first transfer step; a resetting step of resetting an electric potential of the floating diffusion region; a resetting level holding step of holding a signal based on the electric potential of the floating diffusion region reset in the resetting step; a second transfer step of transferring the carriers accumulated in the photoelectric converting means to the floating diffusion region; and a second signal level holding step of holding the carriers transferred to the floating diffusion region in the second transfer step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 5A and 5B show the first embodiment of the invention and are diagrams showing the third example of the construction of the pixel in the solid state image pickup device;

FIGS. 6A and 6B show the first embodiment of the invention and are diagrams showing the fourth example of the construction of the pixel in the solid state image pickup device;

FIGS. 7A and 7B show the first embodiment of the invention and are diagrams showing the fifth example of the construction of the pixel in the solid state image pickup device;

FIG. 9 shows the second embodiment of the invention and is a timing chart for explaining an example of the operation of the solid state image pickup device;

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

First Embodiment

The first embodiment of the invention will now be described with reference to the drawings.

Figure 1:
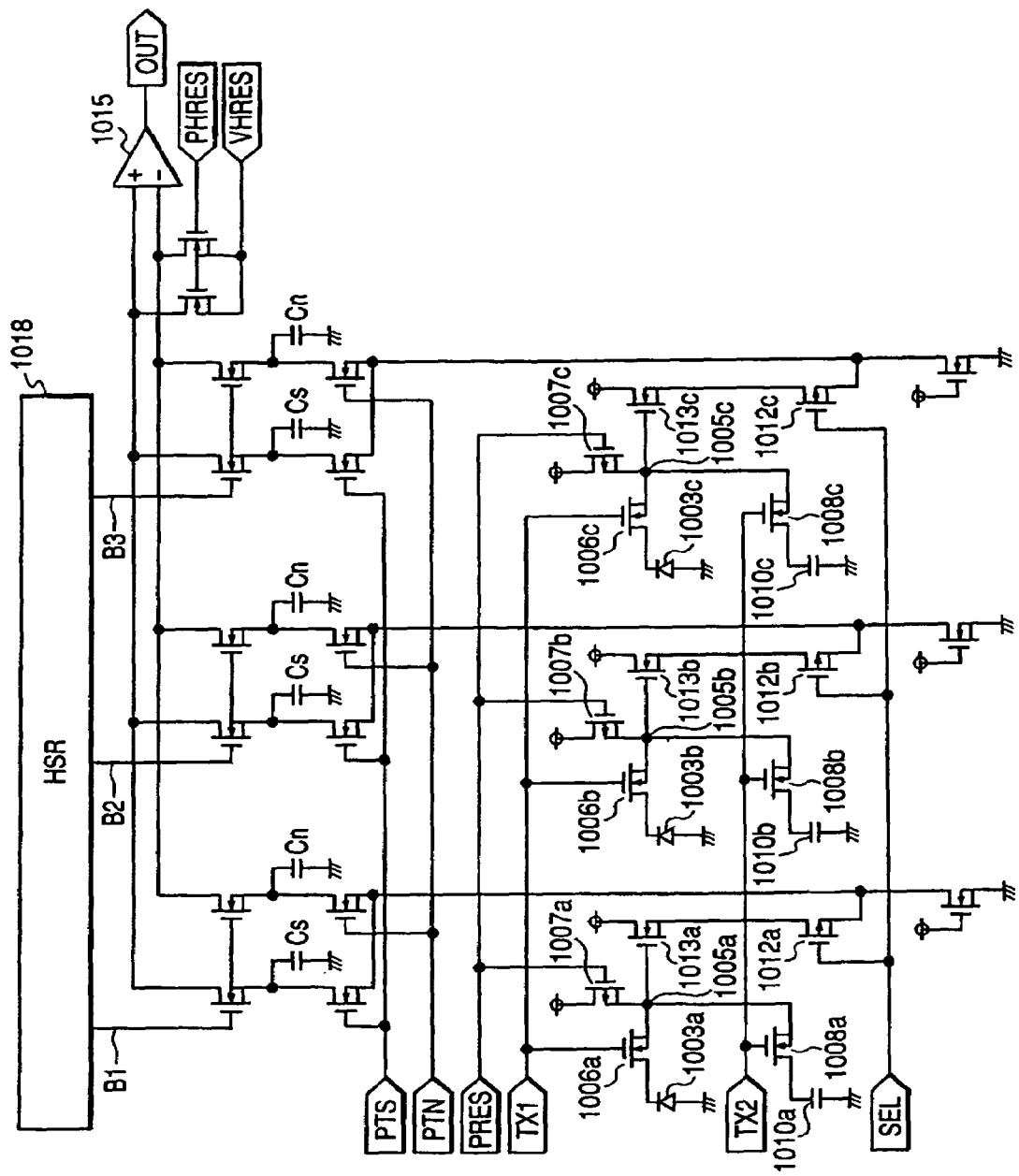
FIG. 1 shows the first embodiment of the invention and is a diagram showing an example of a schematic construction of a solid state image pickup device.

FIG. 1 is a diagram showing an example of a schematic construction of a solid state image pickup device of the embodiment.

In FIG. 1, the solid state image pickup device of the embodiment is constructed by arranging three pixels in a one-dimensional matrix shape of (1 row×3 columns), in which each pixel comprises: a photodiode 1003; a first transfer MOS transistor 1006; a resetting MOS transistor 1007; a second transfer MOS transistor 1008; a selecting MOS transistor 1012; and a source-follower MOS transistor 1013.

Although a plurality of pixels are arranged in the one-dimensional matrix shape of (1 row×3 columns) in FIG. 1, the number of pixels which are arranged is not limited to such a value. For example, it is also possible to arrange a plurality of pixels in a two-dimensional matrix shape of (1080 rows× 1960 columns) and improve resolution.

Charges (serving as carriers) from the photodiode 1003 are transferred to an FD region 1005 through the first transfer MOS transistor 1006. The FD region 1005 is connected to the source-follower MOS transistor 1013. A lateral overflow region 1010 is formed so as to be adjacent to the second transfer MOS transistor 1008. The source-follower MOS transistor 1013 is connected to the selecting MOS transistor 1012 and amplifies a signal based on the carriers transferred to the FD region 1005.

Each of the first transfer MOS transistor 1006, resetting MOS transistor 1007, second transfer MOS transistor 1008, and selecting MOS transistor 1012 is on/off controlled by a control signal (gate signal) which is supplied to each gate. It is assumed that each of the first transfer MOS transistor 1006, resetting MOS transistor 1007, second transfer MOS transistor 1008, and selecting MOS transistor 1012 is turned on (made conductive) when a high-level gate signal is supplied to the gate and that each of those transistors is turned off (disconnected) when a low-level gate signal is supplied to the gate.

Specifically speaking, a control signal TX1 is supplied to the gate of the first transfer MOS transistor 1006. A control signal TX2 is supplied to the gate of the second transfer MOS transistor 1008. A control signal SEL is supplied to the gate of the selecting MOS transistor 1012. A control signal PRES is supplied to the gate of the resetting MOS transistor 1007.

The control signal TX1 is used to transfer the carriers accumulated in the photodiode 1003 to the FD region 1005. The control signal TX2 is used to transfer the carriers which have overflowed from the photodiode 1003 and have been accumulated in the lateral overflow region 1010 to the FD region 1005. The control signal SEL is used to select the pixel. The control signal PRES is used to reset an electric potential of the FD region 1005 to a power potential $V_{DD}$ (for example, +5V).

The solid state image pickup device of the embodiment is provided with a row memory circuit having: a signal level holding capacitor Cs to hold a signal of a level obtained by adding a signal level (S) of the signal transferred to the FD region 1005 and a resetting level (N); and a resetting level holding capacitor Cn to hold a signal of the resetting level (N).

In the embodiment, it is assumed that the holding operation to hold the signal into the signal level holding capacitors Cs is executed on the basis of a control signal PTS and the holding operation to hold the signal into the resetting level holding capacitor Cn is executed on the basis of a control signal PTN.

A horizontal scanning circuit (HSR) 1018 is a circuit to transfer the signal level (S) of one row held in the row memory circuit and the resetting level (N).

A differential amplifier 1015 amplifies a differential signal (signal of the signal level (S)) between the signal obtained by adding the signal level (S) and the resetting level (N) and held in the signal level holding capacitor Cs and the signal of the resetting level (N) held in the resetting level holding capacitor Cn and generates an output signal OUT.

Since the case of the solid state image pickup device having three pixels of (1 row×3 columns) is explained as an example in the embodiment, a vertical scanning circuit is unnecessary. However, in the case of arranging the pixels in a two-dimensional matrix shape of two rows or more, naturally, the vertical scanning circuit to sequentially select the pixels on a row unit basis is necessary.

An example of the operation of the solid state image pickup device of the embodiment will now be described with reference to a timing chart of FIG. 2.

First, at time T1, the high-level control signal SEL is supplied to gates of selecting MOS transistors 1012a to 1012c. Thus, the selecting MOS transistors 1012a to 1012c are turned on. That is, the selecting MOS transistors 1012 are selected on a row unit basis of the matrix. Since the case where the pixels are arranged in a one-dimensional matrix shape of one row has been described as an example in the embodiment, all of the selecting MOS transistors 1012 are selected.

At time T2, the high-level control signal PRES is supplied to resetting MOS transistors 1007a to 1007c, so that the resetting MOS transistors 1007a to 1007c are turned on. Thus, electric potentials of FD regions 1005a to 1005c are reset to the power potential $V_{DD}$. At time T3, the low-level control signal PRES is supplied to the resetting MOS transistors 1007a to 1007c, thereby turning off the resetting MOS transistors 1007a to 1007c. The resetting operations of the FD regions 1005a to 1005c are finished.

At time T4, the high-level control signal PTN is supplied to the row memory circuit. Thus, MOS transistors provided between the selecting MOS transistors 1012a to 1012c and the resetting level holding capacitors Cn are turned on. The signals of the resetting level (N) obtained by the resetting operations are transmitted and held into the resetting level holding capacitors Cn through source-follower MOS transistors 1013a to 1013c and the selecting MOS transistors 1012a to 1012c, respectively.

At time T5, the low-level control signal PTN is supplied to the row memory circuit, thereby turning off the MOS transistors provided between the selecting MOS transistors 1012a to 1012c and the resetting level holding capacitors Cn. The operation to hold the signals of the resetting level (N) into the resetting level holding capacitors Cn is finished.

At time T6, the high-level control signal TX1 is supplied to first transfer MOS transistors 1006a to 1006c. Thus, the first transfer MOS transistors 1006a to 1006c are turned on. Therefore, the carriers accumulated in photodiodes 1003a to 1003c are transferred to the FD regions 1005a to 1005c. At time T7, the low-level control signal TX1 is supplied to first transfer MOS transistors 1006a to 1006c. Thus, the first transfer MOS transistors 1006a to 1006c are turned off. The transfer operation of the carriers accumulated in photodiodes 1003a to 1003c is finished.

At time T8, the high-level control signal TX2 is supplied to second transfer MOS transistors 1008a to 1008c. Thus, second transfer MOS transistors 1008a to 1008c are turned on. Therefore, the carriers which have overflowed from the photodiodes 1003a to 1003c and have been accumulated in lateral overflow regions 1010a to 1010c are transferred to the FD regions 1005a to 1005c. At time T9, the low-level control signal TX2 is supplied to the second transfer MOS transistors 1008a to 1008c, thereby turning off the second transfer MOS transistors 1008a to 1008c. The transfer operation of the carriers which have overflowed from the photodiodes 1003a to 1003c is finished.

At time T10, the high-level control signal PTS is supplied to the row memory circuit. Thus, MOS transistors provided between the selecting MOS transistors 1012a to 1012c and the signal level holding capacitors Cs are turned on. The signals based on the carriers transferred to the FD regions 1005a to 1005c (signals obtained by adding the signal level (S) and the resetting level (N)) are transmitted and held into the signal level holding capacitors Cs. At time T11, the low-level control signal PTS is supplied to the row memory circuit. Thus, the MOS transistors provided between the selecting MOS transistors 1012a to 1012c and the signal level holding capacitors Cs are turned off. The operation to hold the signals based on the carriers transferred to the FD regions 1005a to 1005c into the signal level holding capacitors Cs is finished.

At time T12, the high-level control signal PRES is supplied to the resetting MOS transistors 1007a to 1007c and the high-level control signal TX2 are supplied to the second transfer MOS transistors 1008a to 1008c. Thus, the resetting MOS transistors 1007a to 1007c and the second transfer MOS transistors 1008a to 1008c are turned on. Thus, electric potentials of the FD regions 1005a to 1005c and the lateral overflow regions 1010a to 1010c are reset to the power potential $V_{DD}$.

At time T13, the low-level control signal PRES is supplied to the resetting MOS transistors 1007a to 1007c and the low-level control signal TX2 is supplied to the second transfer MOS transistors 1008a to 1008c, thereby turning off the resetting MOS transistors 1007a to 1007c and the second transfer MOS transistors 1008a to 1008c. The resetting operations of the FD regions 1005a to 1005c and the lateral overflow regions 1010a to 1010c are finished. The resetting operations are the operations for properly executing the next reading operation.

At time T14, the low-level control signal SEL is supplied to the gates of the selecting MOS transistors 1012a to 1012c. Thus, the selecting MOS transistors 1012a to 1012c are turned off. The selecting operation of the selecting MOS transistors 1012 is finished.

At time T15, a high-level control signal B1 is supplied to the row memory circuit. Thus, an MOS transistor provided between the signal level holding capacitor Cs and the differential amplifier 1015 and an MOS transistor provided between the resetting level holding capacitor Cn and the differential amplifier 1015 are turned on. Thus, the signal obtained by adding the signal level (S) and the resetting level (N) is inputted to a positive side input terminal (+) of the differential amplifier 1015. The signal of the resetting level (N) is inputted to a negative side input terminal (−) of the differential amplifier 1015.

At time T16, the low-level control signal B1 is supplied to the row memory circuit, thereby turning off the MOS transistor provided between the signal level holding capacitor Cs and the differential amplifier 1015 and the MOS transistor provided between the resetting level holding capacitor Cn and the differential amplifier 1015. The reading operation in the pixels of the first column is finished.

At time T17, a high-level control signal PHRES is supplied. Thus, the differential amplifier 1015 generates the signal OUT of the signal level (S) in the pixels of the first column. At time T18, the low-level control signal PHRES is supplied and the outputting operation in the pixels of the first column is finished.

For a time interval of T19 to T22 and for a time interval of T23 to T26, the outputting operation of signals in the pixels of the second and third columns is executed. Thus, the operations to read out the signal and output the signals are executed in all of the pixels.

According to the embodiment as mentioned above, the carriers which have overflowed in the lateral overflow regions 1010a to 1010c and the carriers accumulated in photodiodes 1003a to 1003c are transferred to the FD regions 1005a to 1005c. The signals based on those carriers are added, held in the signal level holding capacitor Cs, and read out therefrom, thereby widening the dynamic range of the solid state image pickup device.

Specific examples of the structure of the pixel for widening the dynamic range as mentioned above will now be described.

FIRST EXAMPLE

Figures 3A, 3B:
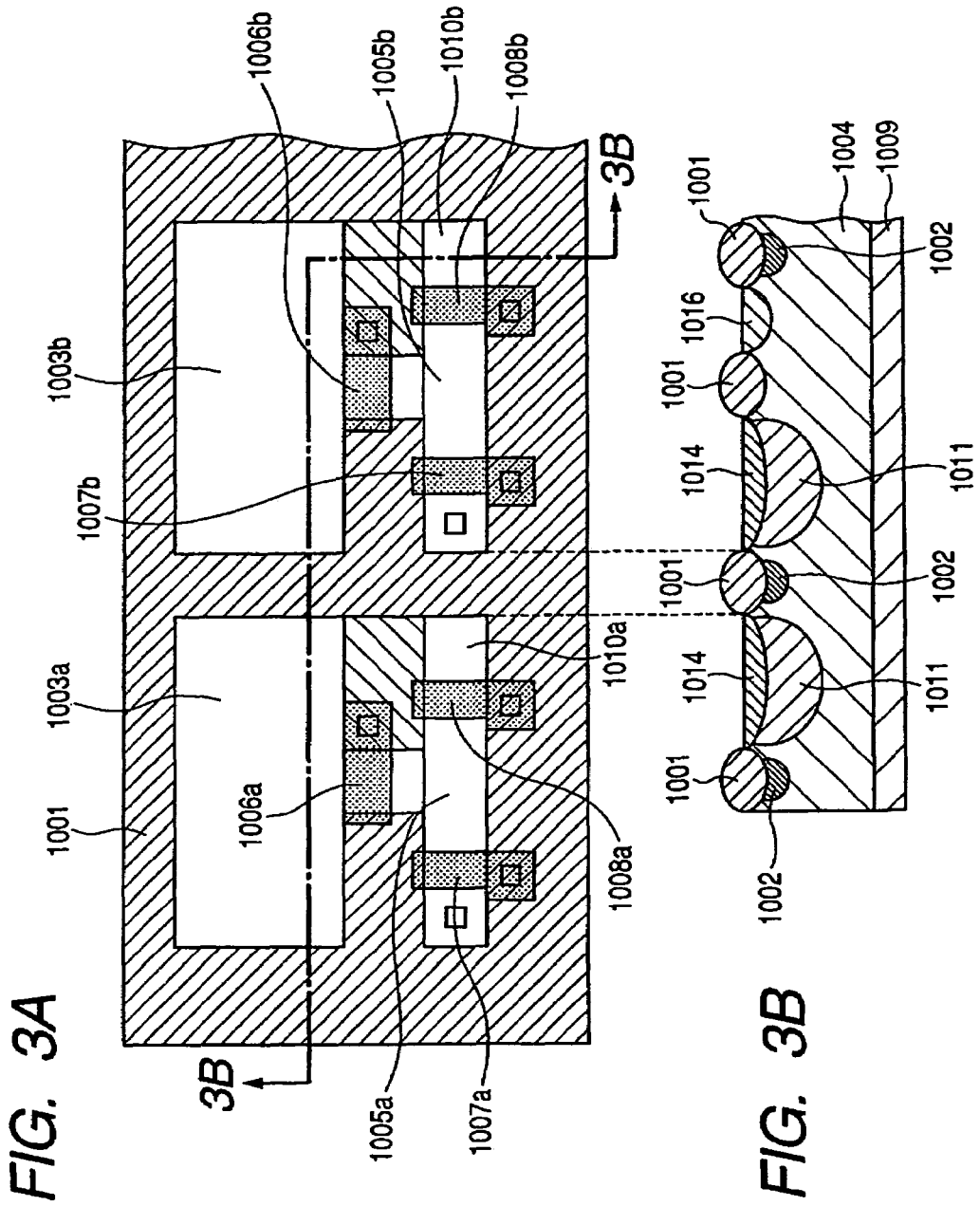
FIGS. 3A and 3B show the first embodiment of the invention and are diagrams showing the first example of a construction of each pixel in the solid state image pickup device.

FIG. 3A shows the first example of the embodiment and is a plan view showing a construction of each pixel in the solid state image pickup device. FIG. 3B is a cross sectional view taken along the line 3B-3B in FIG. 3A. Although only component elements necessary for explanation of the embodiment are shown in FIGS. 3A and 3B, component elements other than those shown in FIGS. 3A and 3B may be provided. Although only pixels of the first and second columns are shown in FIGS. 3A and 3B, naturally, the pixels of the third column are provided in adjacent to the pixels of the second column.

As shown in FIG. 3B, a p-type well (p-well) 1004 is formed on an n-type semiconductor substrate 1009. An n-type region 1011 constructing the photodiodes 1003a and 1003b is formed on the obverse side of the p-well 1004. A p-type region 1014 to realize an embedded photodiode structure is formed on the surface of the n-type region 1011.

The first transfer MOS transistors 1006a and 1006b are formed at positions adjacent to the photodiodes 1003a and 1003b as mentioned above. An insulating film 1001 such as a selective oxide film ($SiO_2$) film or the like formed by, for example, an LOCOS (Local Oxidation of Silicon) method is formed around the photodiodes 1003a and 1003b excluding the portions formed with the gates of the first transfer MOS transistors 1006a and 1006b.

The FD regions 1005a and 1005b are formed in opposition to the photodiodes 1003a and 1003b so as to sandwich the gates of the first transfer MOS transistors 1006a and 1006b and the insulating film 1001 adjacent to those gates. Capacitors each comprising a junction capacitor of an n-type region 1016 formed on the surface of the p-well 1004 and the p-well 1004 and the like are formed in the FD regions 1005a and 1005b. As mentioned above, when the gates of the first transfer MOS transistors 1006a and 1006b are turned on, the carriers accumulated in photodiodes 1003a and 1003b are transferred to the FD regions 1005a and 1005b.

The resetting MOS transistors 1007a and 1007b and the second transfer MOS transistors 1008a and 1008b are formed in side edge portions of the FD regions 1005a and 1005b, respectively. The lateral overflow regions 1010a and 1010b are formed in opposition to the FD regions 1005a and 1005b so as to sandwich the gates of the second transfer MOS transistors 1008a and 1008b. Capacitors each comprising a junction capacitor of the n-type region 1016 formed on the surface of the p-well 1004 and the p-well 1004 and the like are formed in the lateral overflow regions 1010a and 1010b.

As mentioned above, when the gates of the second transfer MOS transistors 1008a and 1008b are turned on, the carriers accumulated in the lateral overflow regions 1010a and 1010b are transferred to the FD regions 1005a and 1005b. In this example, the FD regions 1005a and 1005b and the lateral overflow regions 1010a and 1010b are formed in the same step.

Channel stopper regions 1002 serving as p-type regions whose concentration is higher than that of the p-well 1004 are formed in lower edges of the insulating films 1001 formed in the regions excluding the regions sandwiched between the photodiodes 1003a and 1003b and the lateral overflow regions 1010a and 1010b and the regions sandwiched between those regions and the first transfer MOS transistors 1006a and 1006b (regions whose direction of the oblique lines differs from that of other regions: hereinbelow, referred to as "charge transfer regions").

By the channel stopper regions 1002, it is possible to prevent the carriers accumulated in the photodiodes 1003a and 1003b from flowing into other pixels.

As mentioned above, according to this example, since no channel stopper regions 1002 are formed in the lower edges of the insulating films 1001 formed in the charge transfer regions, the carriers which have overflowed in the photodiodes 1003a and 1003b can be accumulated in the lateral overflow regions 1010a and 1010b and the FD regions 1005a and 1005b.

SECOND EXAMPLE

Figures 4A, 4B:
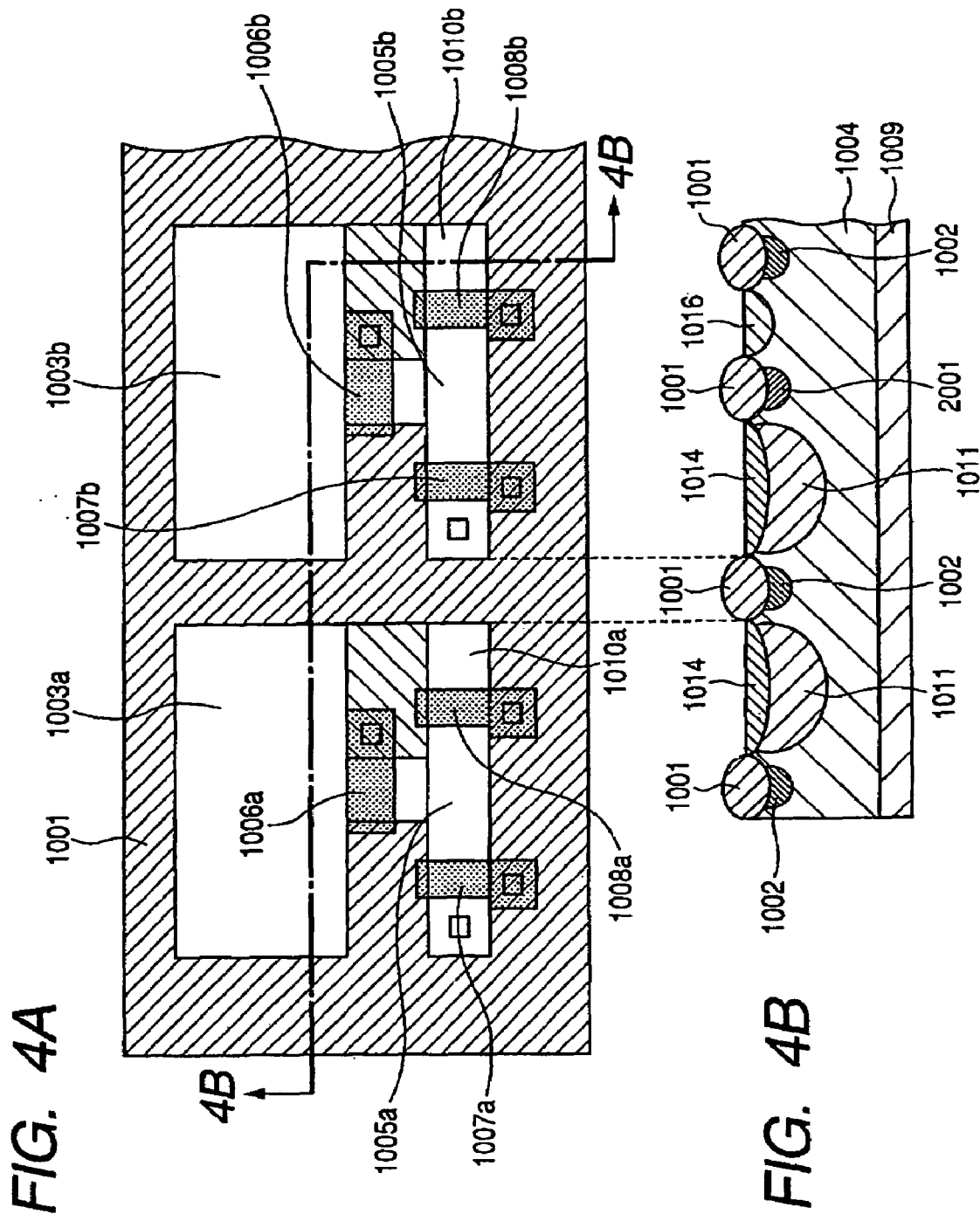
FIGS. 4A and 4B show the first embodiment of the invention and are diagrams showing the second example of the construction of the pixel in the solid state image pickup device.

FIG. 4A shows the second example of the embodiment and is a plan view showing a construction of each pixel in the solid state image pickup device. FIG. 4B is a cross sectional view taken along the line 4B-4B in FIG. 4A. Only necessary component elements in the pixels of the first and second columns are shown in FIGS. 4A and 4B in a manner similar to FIGS. 3A and 3B. The same and similar portions as those in the first example are designated by the same reference numerals as those in FIGS. 3A and 3B and their detailed description is omitted.

In the first example, no channel stopper regions 1002 are formed in the lower edge regions of the insulating films 1001 formed in the charge transfer regions. However, in the second example, as shown in FIGS. 4A and 4B, p-type regions 2001 whose concentration is higher than that of the p-well 1004 and is lower than that of the channel stopper regions 1002 are formed in the lower edges of the insulating films 1001 formed in the charge transfer regions.

By constructing as mentioned above, an amount of carriers which have overflowed from the photodiodes 1003a and 1003b and are accumulated in the lateral overflow regions 1010a and 1010b and the FD regions 1005a and 1005b can be controlled by the concentration of the p-type regions 2001 by the simple construction as much as possible.

THIRD EXAMPLE

FIG. 5A shows the third example of the embodiment and is a plan view showing a construction of each pixel in the solid state image pickup device. FIG. 5B is a cross sectional view taken along the line 5B-5B in FIG. 5A. Only necessary component elements in the pixels of the first and second columns are shown in FIGS. 5A and 5B in a manner similar to FIGS. 3A and 3B. The same and similar portions as those in the first and second examples are designated by the same reference numerals as those in FIGS. 3A to 4B and their detailed description is omitted.

In the third example, as shown in FIGS. 5A and 5B, p-type regions 3001 are formed in the regions in the p-well 1004 and below the channel stopper regions 1002 (each region between the photodiodes 1003a and 1003b). As mentioned above, each pixel in the third example has a construction obtained by adding the p-type regions 3001 to the construction of the second example. A concentration difference between the p-type region 3001 and the channel stopper region 1002 can be set to an arbitrary value.

By constructing as mentioned above, since an amount of carriers which are accumulated in the lateral overflow regions 1010a and 1010b and the FD regions 1005a and 1005b can be controlled by the concentrations of the two kinds of p-type regions 2001 and 3001, it can be controlled at higher precision than that in the second example.

FOURTH EXAMPLE

FIG. 6A shows the fourth example of the embodiment and is a plan view showing a construction of each pixel in the solid state image pickup device. FIG. 6B is a cross sectional view taken along the line 6B-6B in FIG. 6A. Only necessary component elements in the pixels of the first and second columns are shown in FIGS. 6A and 6B in a manner similar to FIGS. 3A and 3B. The same and similar portions as those in the first to third examples are designated by the same reference numerals as those in FIGS. 3A to 5B and their detailed description is omitted.

In the fourth example, as shown in FIGS. 6A and 6B, channel stopper regions 3002 are also formed in the lower edge regions of the insulating films 1001 formed in the charge transfer regions. As mentioned above, each pixel of the fourth example has a construction in which the p-type regions 2001 in the construction of each pixel of the third example are replaced with the channel stopper regions 3002.

By constructing as mentioned above, an amount of carriers which are accumulated in the lateral overflow regions 1010a and 1010b and the FD regions 1005a and 1005b can be controlled by the channel stopper regions 3002. As compared with the third example, there is no need to newly form the p-type regions 2001. Also in this example, an amount of carriers which are accumulated in the lateral overflow regions 1010a and 1010b and the FD regions 1005a and 1005b can be controlled by the simple construction as much as possible.

FIFTH EXAMPLE

FIG. 7A shows the fifth example of the embodiment and is a plan view showing a construction of each pixel in the solid state image pickup device. FIG. 7B is a cross sectional view taken along the line 7B-7B in FIG. 7A. Only necessary component elements in the pixels of the first and second columns are shown in FIGS. 7A and 7B in a manner similar to FIGS. 3A and 3B. The same and similar portions as those in the first to fourth examples are designated by the same reference numerals as those in FIGS. 3A to 6B and their detailed description is omitted.

In the fifth example, as shown in FIGS. 7A and 7B, p-type regions 5001 whose concentration is higher than that of the p-well 1004 are formed in the regions in the p-well 1004 and below the n-type regions 1016. As mentioned above, each pixel in the fifth example has a construction obtained by adding the p-type regions 5001 to the pixel of the fourth example. In the fifth example, the pixel is constructed so that an interval between the p-type region 5001 and the channel stopper region 1002 existing at the position nearest to the p-type region 5001 is larger than that between the p-type region 3001 and the channel stopper region 1002 existing at the position nearest to the p-type region 3001.

By constructing as mentioned above, an amount of carriers which are accumulated in the lateral overflow regions 1010a and 1010b and the FD regions 1005a and 1005b can be controlled by the concentration, size, and position of the p-type region 5001. Thus, the amount of carriers which are accumulated in the lateral overflow regions 1010a and 1010b and the FD regions 1005a and 1005b can be precisely controlled by the simple construction as high as possible. The p-type region 5001 can be also formed between the photodiode 1003 and the lateral overflow region 1010 in the pixel to which the photodiode 1003 belongs.

Second Embodiment

The second embodiment of the invention will now be described. In the description of the second embodiment, the same and similar portions as those in the foregoing first embodiment are designated by the same reference numerals as those in FIGS. 1 to 7B and their detailed description is omitted.

Figure 8:
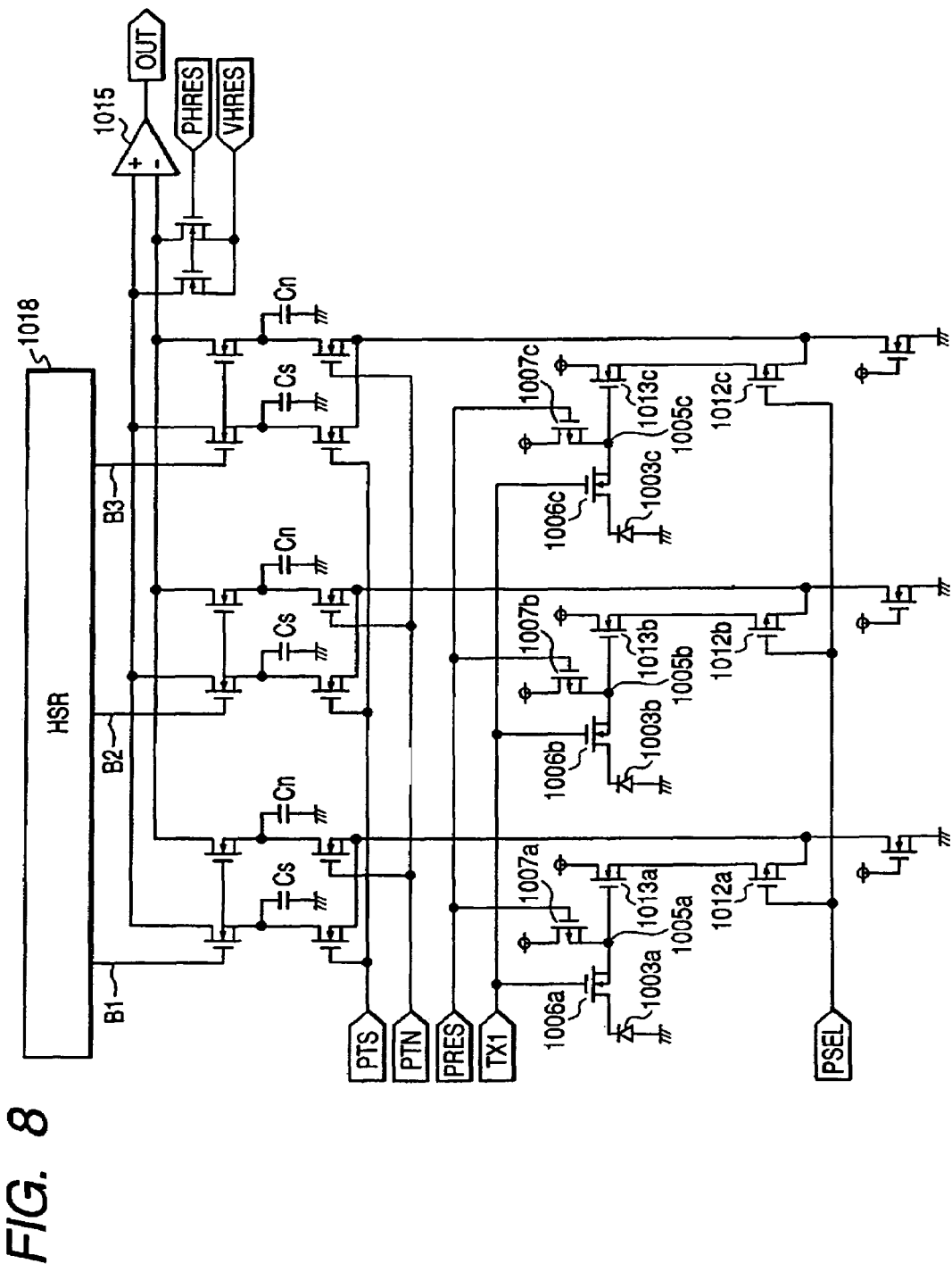
FIG. 8 shows the second embodiment of the invention and is a diagram showing an example of a schematic construction of a solid state image pickup device.

FIG. 8 is a diagram showing an example of a schematic construction of the solid state image pickup device of the embodiment.

As shown in FIG. 8, in the solid state image pickup device of the second embodiment, the second transfer MOS transistor 1008 is not provided and the lateral overflow region 1010 is not formed. A construction of other circuits is substantially the same as that of the solid state image pickup device of the first embodiment shown in FIG. 1.

An example of the operation of the solid state image pickup device of the second embodiment will now be described with reference to a timing chart of FIG. 9.

First, at time T1, the high-level control signal SEL is supplied to the gates of the selecting MOS transistors 1012a to 1012c, thereby turning on the selecting MOS transistors 1012a to 1012c. The selecting MOS transistors 1012 are selected on a row unit basis of the matrix.

At time T32, a high-level control signal PTX is supplied to the first transfer MOS transistors 1006a to 1006c, so that the first transfer MOS transistors 1006a to 1006c are turned on. Thus, the carriers accumulated in the photodiodes 1003a to 1003c are transferred to the FD regions 1005a to 1005c. At this time, the carriers which have overflowed to the FD regions 1005a to 1005c are also transferred to the FD regions 1005a to 1005c during the accumulating period of time of the carriers in the photodiodes 1003a and 1003b. As mentioned above, in the embodiment, when the first transfer MOS transistors 1006a to 1006c are turned on, the carriers accumulated in the photodiodes 1003a and 1003b and the carriers which have overflowed from the photodiodes 1003a and 1003b are transferred to the FD regions 1005a to 1005c.

At time T33, the low-level control signal PTX is supplied to the first transfer MOS transistors 1006a to 1006c, thereby turning off the first transfer MOS transistors 1006a to 1006c. The transfer operation of the carriers from the photodiodes 1003a to 1003c is finished.

At time T34, the high-level control signal PTS is supplied to the row memory circuit. Thus, the MOS transistors provided between the selecting MOS transistors 1012a to 1012c and the signal level holding capacitors Cs are turned on. The signals based on the carriers transferred to the FD regions 1005a to 1005c (signals obtained by adding the signal level (S) and the resetting level (N)) are transmitted and held into the signal level holding capacitors Cs. At time T35, the low-level control signal PTS is supplied to the row memory circuit. Thus, the MOS transistors provided between the selecting MOS transistors 1012a to 1012c and the signal level holding capacitors Cs are turned off. The operation to hold the signals based on the carriers transferred to the FD regions 1005a to 1005c into the signal level holding capacitors Cs is finished.

At time T36, the high-level control signal PRES is supplied to the resetting MOS transistors 1007a to 1007c. Thus, the resetting MOS transistors 1007a to 1007c are turned on. Thus, the FD regions 1005a to 1005c are reset to the power potential $V_{DD}$. At time T37, the low-level control signal PRES is supplied to the resetting MOS transistors 1007a to 1007c, thereby turning off the resetting MOS transistors 1007a to 1007c. The resetting operations of the FD regions 1005a to 1005c are finished.

At time T38, the high-level control signal PTN is supplied to the row memory circuit. Thus, the MOS transistors provided between the selecting MOS transistors 1012a to 1012c and the resetting level holding capacitors Cn are turned on. The signals of the resetting level (N) obtained by the resetting operations are transmitted and held into the resetting level holding capacitors Cn through the source-follower MOS transistors 1013a to 1013c and the selecting MOS transistors 1012a to 1012c, respectively. At time T39, the low-level control signal PTN is supplied to the row memory circuit, thereby turning off the MOS transistors provided between the selecting MOS transistors 1012a to 1012c and the resetting level holding capacitors Cn. The operation to hold the signals of the resetting level (N) into the resetting level holding capacitors Cn is finished.

At time T40, the low-level control signal SEL is supplied to the gates of the selecting MOS transistors 1012a to 1012c, thereby turning off the selecting MOS transistors 1012a to 1012c. The selecting operation of the selecting MOS transistors 1012 is finished.

Figure 2:
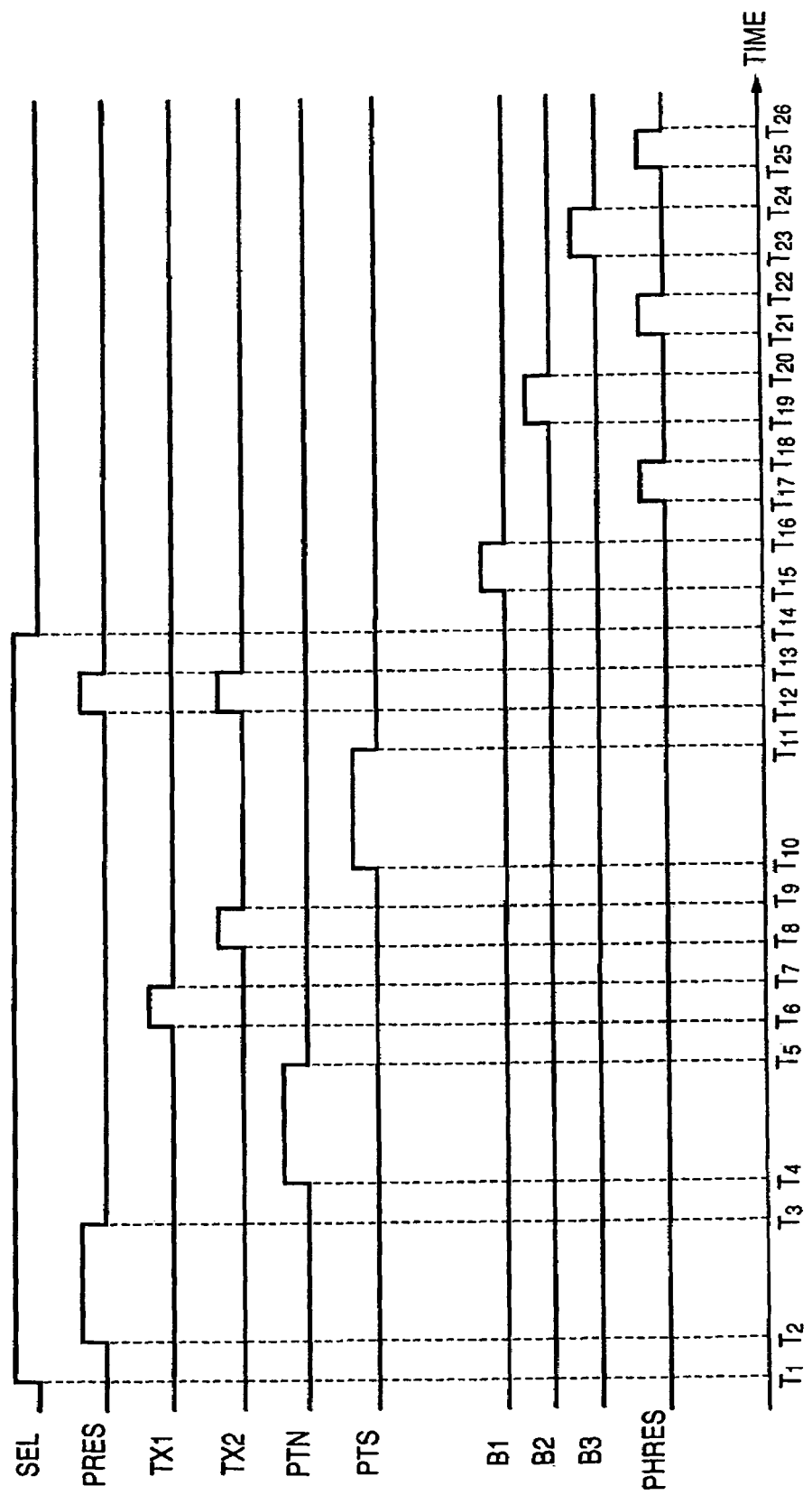
FIG. 2 shows the first embodiment of the invention and is a timing chart for explaining an example of the operation of the solid state image pickup device.

After that, for a time interval of T41 to T52, the outputting operation of the signals in the pixels of the first to third columns is executed every pixel in a manner similar to the case for a time interval of T15 to T26 in FIG. 2 described in the first embodiment.

An example of a structure of each pixel in the embodiment will be described.

Figure 10A:
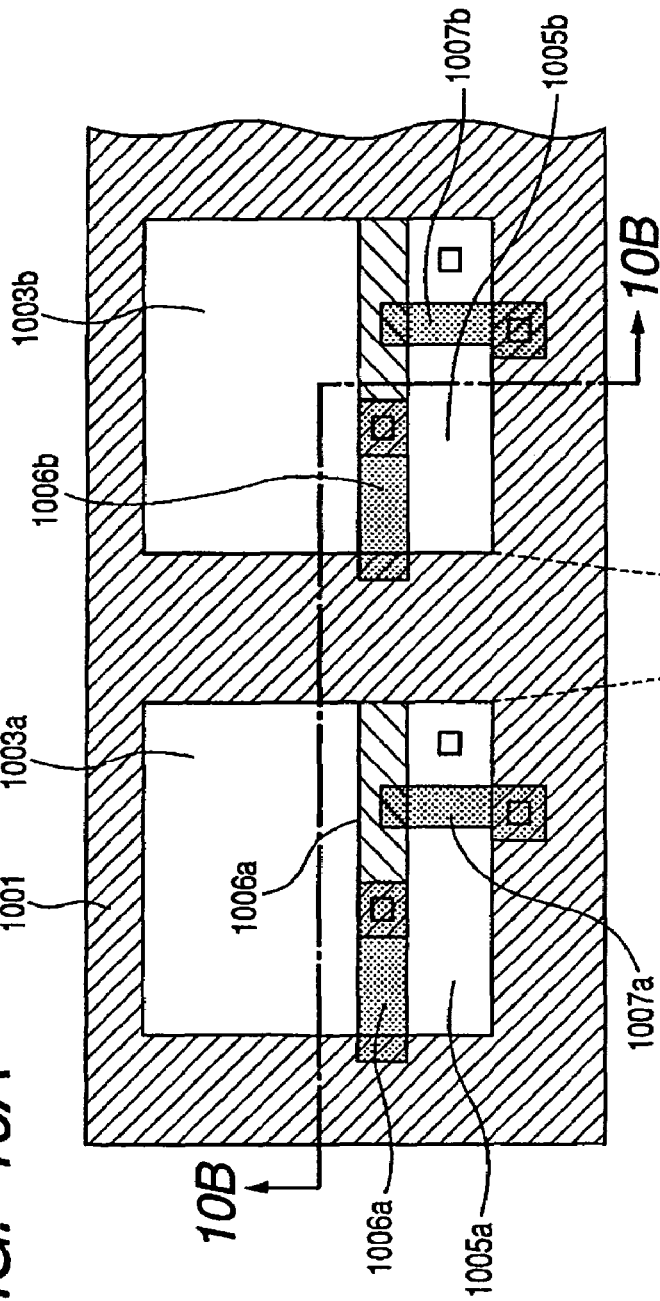
FIGS. 10A and 10B show the second embodiment of the invention and are diagrams showing an example of a construction of each pixel in the solid state image pickup device.
Figure 10B:
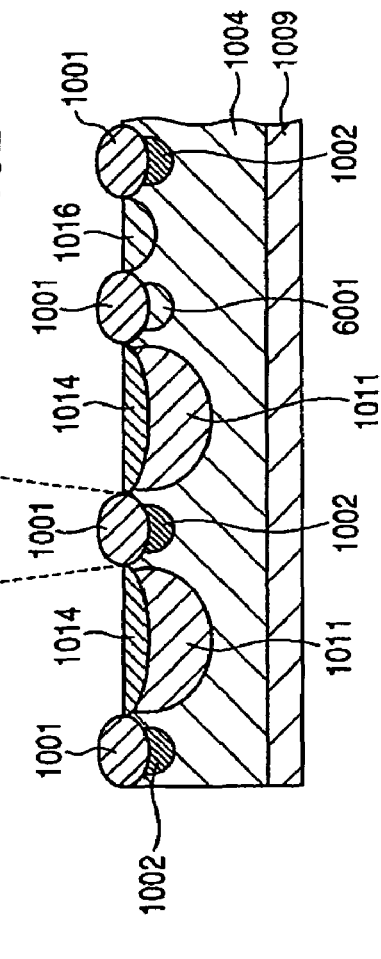

FIG. 10A is a plan view showing an example of a construction of each pixel in the solid state image pickup device in the second embodiment. FIG. 10B is a cross sectional view taken along the line 10B-10B in FIG. 10A. Only necessary component elements in the pixels of the first and second columns are also shown in FIGS. 10A and 10B in a manner similar to FIGS. 3A and 3B described in the first embodiment.

As mentioned above, in the second embodiment, the second transfer MOS transistor 1008 is not provided and the lateral overflow region 1010 is not formed in the pixel (refer to FIG. 10A).

The channel stopper regions 1002 serving as p-type regions whose concentration is higher than that of the p-well 1004 are formed in the lower edges of the insulating films 1001 in the regions excluding the regions sandwiched between the photodiodes 1003a and 1003b and the resetting MOS transistors 1007a and 1007b and the regions sandwiched between those regions and the first transfer MOS transistors 1006a and 1006b (regions whose direction of the oblique lines differs from that of other regions: hereinbelow, referred to as "second charge transfer regions").

p-type regions 6001 whose concentration is higher than that of the p-well 1004 and is lower than that of the channel stopper regions 1002 are formed in the lower edges of the insulating films 1001 formed in the second charge transfer regions.

As mentioned above, in the embodiment, the p-type regions 6001 whose concentration is higher than that of the p-well 1004 and is lower than that of the channel stopper regions 1002 are formed in the lower edges of the insulating films 1001 formed in the second charge transfer regions, and the carriers accumulated in the photodiodes 1003a to 1003c and the carriers which have overflowed from the photodiodes 1003a to 1003c for the accumulating period of time of the carriers are transferred to the FD regions 1005a to 1005c. Therefore, the dynamic range of the solid state image pickup device can be widened by a construction simpler than that of the first embodiment. By applying the driving method of the solid state image pickup device described in FIG. 9, for example, even in the same circuit as the conventional solid state image pickup device disclosed in Japanese Patent Application Laid-Open No. 2001-186414 mentioned above, the dynamic range of the solid state image pickup device can be widened more than that of the conventional solid state image pickup device.

Third Embodiment

The third embodiment of the invention will now be described. In the description of the third embodiment, the same and similar portions as those in the foregoing first embodiment are designated by the same reference numerals as those in FIGS. 1 to 7B and their detailed description is omitted.

Figure 11:
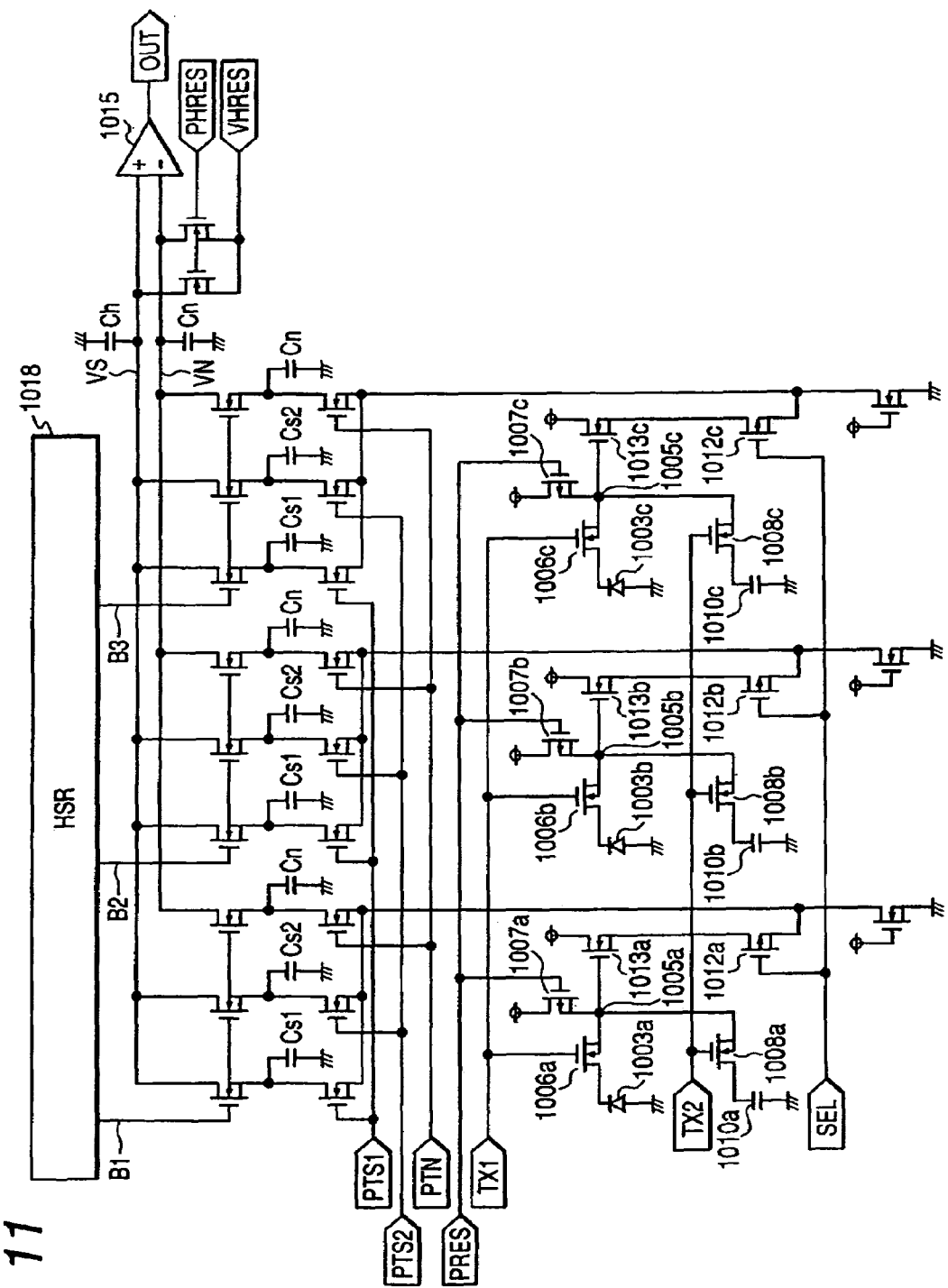
FIG. 11 shows the third embodiment of the invention and is a diagram showing an example of a schematic construction of a solid state image pickup device.

FIG. 11 is a diagram showing an example of a schematic construction of the solid state image pickup device of the embodiment.

In the first embodiment, the carriers accumulated in the photodiode 1003 and the carriers which have overflowed from the photodiodes 1003 to the lateral overflow region 1010 have been held in the same signal level holding capacitors Cs (time interval from T5 to T11 in FIG. 2). However, according to the solid state image pickup device of the embodiment, the capacitor to hold the carriers accumulated in the photodiode 1003 and the capacitor to hold the carriers which have overflowed from the photodiodes 1003 to the lateral overflow region 1010 are separately provided.

Specifically speaking, as shown in FIG. 11, the solid state image pickup device of the embodiment has: a first signal level holding capacitor Cs1 to hold the carriers which have overflowed from the photodiodes 1003 to the lateral overflow region 1010; and a second signal level holding capacitor Cs2 to hold the carriers accumulated in the photodiode 1003.

Figure 12:
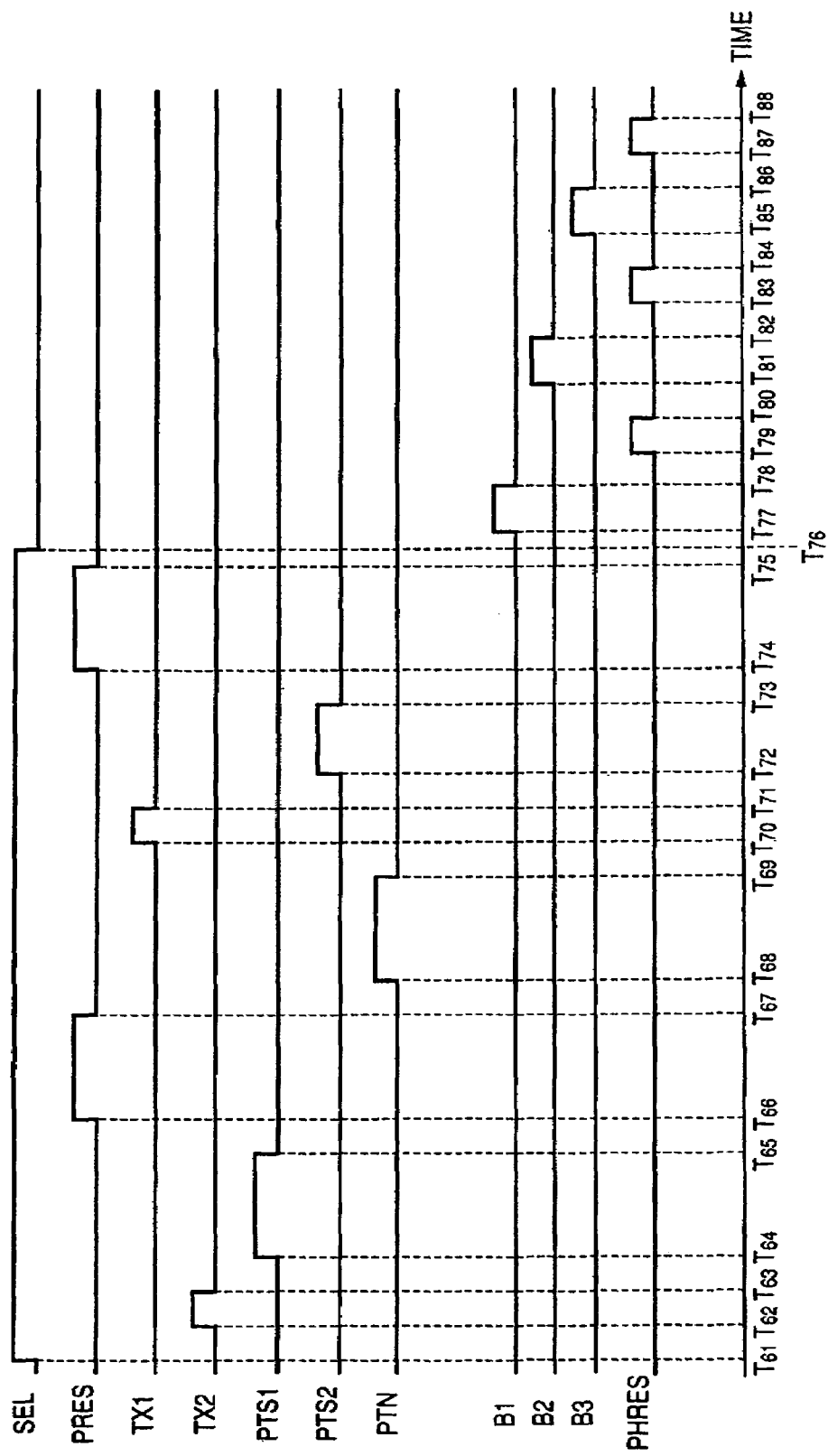
FIG. 12 shows the fourth embodiment of the invention and is a timing chart for explaining an example of the operation of a solid state image pickup device.

An example of the operation of the solid state image pickup device of the embodiment will now be described with reference to a timing chart of FIG. 12.

First, at time T61, the high-level control signal SEL is supplied to the gates of the selecting MOS transistors 1012a to 1012c, thereby turning on the selecting MOS transistors 1012a to 1012c. The selecting MOS transistors 1012 are selected on a row unit basis of the matrix.

At time T62, the high-level control signal TX2 is supplied to the second transfer MOS transistors 1008a to 1008c, so that the second transfer MOS transistors 1008a to 1008c are turned on. Thus, the carriers which have overflowed from the photodiodes 1003a to 1003c and have been accumulated in the lateral overflow regions 1010a to 1010c are transferred to the FD regions 1005a to 1005c. At time T63, the low-level control signal TX2 is supplied to the second transfer MOS transistors 1008a to 1008c, thereby turning off the second transfer MOS transistors 1008a to 1008c. The transfer operations of the carriers which have overflowed from the photodiodes 1003a to 1003c are finished.

At time T64, a high-level control signal PTS1 is supplied to the row memory circuit. Thus, the MOS transistors provided between the selecting MOS transistors 1012a to 1012c and the first signal level holding capacitors Cs1 are turned on. The signals based on the carriers transferred to the FD regions 1005 (signals obtained by adding the signal level based on the carriers which have overflowed from the photodiodes 1003a to 1003c and the resetting level (N)) are transmitted and held into the first signal level holding capacitors Cs1.

At time T65, the low-level control signal PTS1 is supplied to the row memory circuit, thereby turning off the MOS transistors provided between the selecting MOS transistors 1012a to 1012c and the first signal level holding capacitors Cs1. The operation to hold the signals based on the carriers transferred to the FD region 1005 into the first signal level holding capacitors Cs1 is finished.

At time T66, the high-level control signal PRES is supplied to the resetting MOS transistors 1007a to 1007c, so that the resetting MOS transistors 1007a to 1007c are turned on. Thus, electric potentials of the FD regions 1005a to 1005c are reset to the power potential $V_{DD}$. At time T67, the low-level control signal PRES is supplied to the resetting MOS transistors 1007a to 1007c, thereby turning off the resetting MOS transistors 1007a to 1007c. The resetting operations of the FD regions 1005a to 1005c is finished.

At time T68, the high-level control signal PTN is supplied to the row memory circuit. Thus, the MOS transistors provided between the selecting MOS transistors 1012a to 1012c and the resetting level holding capacitors Cn are turned on. The signals of the resetting level (N) obtained by the resetting operations are transmitted and held into the resetting level holding capacitors Cn through the source-follower MOS transistors 1013a to 1013c and the selecting MOS transistors 1012a to 1012c, respectively.

At time T69, the low-level control signal PTN is supplied to the row memory circuit. Thus, the MOS transistors provided between the selecting MOS transistors 1012a to 1012c and the resetting level holding capacitors Cn are turned off. The operation to hold the signals of the resetting level (N) into the resetting level holding capacitors Cn is finished.

At time T70, the high-level control signal TX1 is supplied to first transfer MOS transistors 1006a to 1006c. Thus, the first transfer MOS transistors 1006a to 1006c are turned on. Therefore, the carriers accumulated in photodiodes 1003a to 1003c are transferred to the FD regions 1005a to 1005c. At time T71, the low-level control signal TX1 is supplied to first transfer MOS transistors 1006a to 1006c, thereby turning off the first transfer MOS transistors 1006a to 1006c. The transfer operation of the carriers accumulated in the photodiodes 1003a to 1003c is finished.

At time T72, a high-level control signal PTS2 is supplied to the row memory circuit. Thus, the MOS transistors provided between the selecting MOS transistors 1012a to 1012c and the second signal level holding capacitors Cs2 are turned on. The signals based on the carriers transferred to the FD regions 1005 (signals obtained by adding the signal level based on the carriers accumulated in the photodiodes 1003a to 1003c and the resetting level (N)) are transmitted and held into the second signal level holding capacitors Cs2.

At time T73, the low-level control signal PTS2 is supplied to the row memory circuit, thereby turning off the MOS transistors provided between the selecting MOS transistors 1012a to 1012c and the second signal level holding capacitors Cs2. The operation to hold the signals based on the carriers transferred to the FD regions 1005 into the second signal level holding capacitors Cs2 is finished.

At time T74, the high-level control signal PRES is supplied to the resetting MOS transistors 1007a to 1007c, thereby turning on the resetting MOS transistors 1007a to 1007c. The FD regions 1005a to 1005c are reset to the power potential $V_{DD}$. At time T75, the low-level control signal PRES is supplied to the resetting MOS transistors 1007a to 1007c, thereby turning off the resetting MOS transistors 1007a to 1007c. The resetting operations of the FD regions 1005a to 1005c are finished.

At time T76, the low-level control signal SEL is supplied to the gates of the selecting MOS transistors 1012a to 1012c, thereby turning off the selecting MOS transistors 1012a to 1012c. The selecting operation of the selecting MOS transistors 1012 is finished.

At time T77, the high-level control signal B1 is supplied to the row memory circuit. Thus, the MOS transistors provided between the first signal level holding capacitors Cs1 and the differential amplifier 1015, the MOS transistor provided between the second signal level holding capacitors Cs2 and the differential amplifier 1015, and the MOS transistor provided between the resetting level holding capacitor Cn and the differential amplifier 1015 are turned on. Thus, the signal obtained by adding the signal level (S) based on the carriers accumulated in the photodiode 1003a and the carriers which have overflowed from the photodiode 1003a into the lateral overflow region 1010a and the resetting level (N) is inputted to the positive side input terminal (+) of the differential amplifier 1015. The signal of the resetting level (N) is inputted to the negative side input terminal (−) of the differential amplifier 1015.

At time T78, the low-level control signal B1 is supplied to the row memory circuit, thereby turning off the MOS transistors provided between the first signal level holding capacitors Cs1 and the differential amplifier 1015, the MOS transistor provided between the second signal level holding capacitors Cs2 and the differential amplifier 1015, and the MOS transistor provided between the resetting level holding capacitor Cn and the differential amplifier 1015. The reading operation in the pixels of the first column is finished.

At time T79, the high-level control signal PHRES is supplied. Thus, the differential amplifier 1015 generates the signal OUT of the signal level (S) in the pixels of the first column. At time T80, the low-level control signal PHRES is supplied and the outputting operation in the pixels of the first column is finished.

For a time interval from T81 to T84 and for a time interval from T85 to T88, the outputting operation in the pixels of the second and third columns is executed. Thus, the operations for reading out the signals and outputting have been executed for all of the pixels.

The voltage which is outputted from the differential amplifier 1015 will now be described.

It is now assumed that a capacitance of the first signal level holding capacitor Cs1 is equal to C1 [F], a capacitance of the resetting level holding capacitor Cn is equal to C2 [F], a capacitance of the second signal level holding capacitor Cs2 is equal to C3 [F], a voltage of the first signal level holding capacitor Cs1 is equal to V1 [V], a voltage of the resetting level holding capacitor Cn is equal to V2 [V], and a voltage of the second signal level holding capacitor Cs2 is equal to V3 [V]. Further, it is assumed that a capacitance of each of horizontal output lines connected to the positive side input terminal (+) and the negative side input terminal (−) of the differential amplifier 1015 is equal to Ch [F]. Thus, a voltage VS [V] which is inputted to the positive side input terminal (+) of the differential amplifier 1015 and a voltage VN [V] which is inputted to the negative side input terminal (−) are expressed by the following equations (1) and (2).

$$VS = (V1 \times C1 + V3 \times C3)/Ch \quad (1)$$
$$= (V1 + V3) \times C1/Ch$$

$$VN = V2 \times C2/Ch = 2 \times V2 \times C1/Ch \quad (2)$$

where, it is assumed that the capacitance C1 of the first signal level holding capacitor Cs1 is equal to the capacitance C3 of the second signal level holding capacitor Cs2 and each of the capacitance C1 of the first signal level holding capacitor Cs1 and the capacitance C3 of the second signal level holding capacitor Cs2 is equal to the half of the capacitance C2 of the resetting level holding capacitor Cn (C2=2×C1=2×C3).

Therefore, a voltage based on a difference between the voltage values VS and VN of the equations (1) and (2) is outputted from the differential amplifier 1015.

As described above, according to the embodiment, since the capacitor to hold the carriers accumulated in the photodiode 1003 (second signal level holding capacitor Cs2) and the capacitor to hold the carriers which have overflowed from the photodiode 1003 into the lateral overflow region 1010 (first signal level holding capacitor Cs1) are separately provided. Therefore, in addition to the effect described in the foregoing first embodiment, such an effect that the noises of the voltage (signal) which is outputted from the differential amplifier 1015 can be further reduced is obtained.

A structure of each pixel in the embodiment is substantially the same as that in the first embodiment and any one of the structures shown in the foregoing first to fifth examples may be used (refer to FIGS. 3A to 7B).

Other Embodiments

An embodiment in the case where the solid state image pickup device of each of the foregoing embodiments is applied to a still camera will now be described in detail with reference to FIG. 13.

Figure 13:
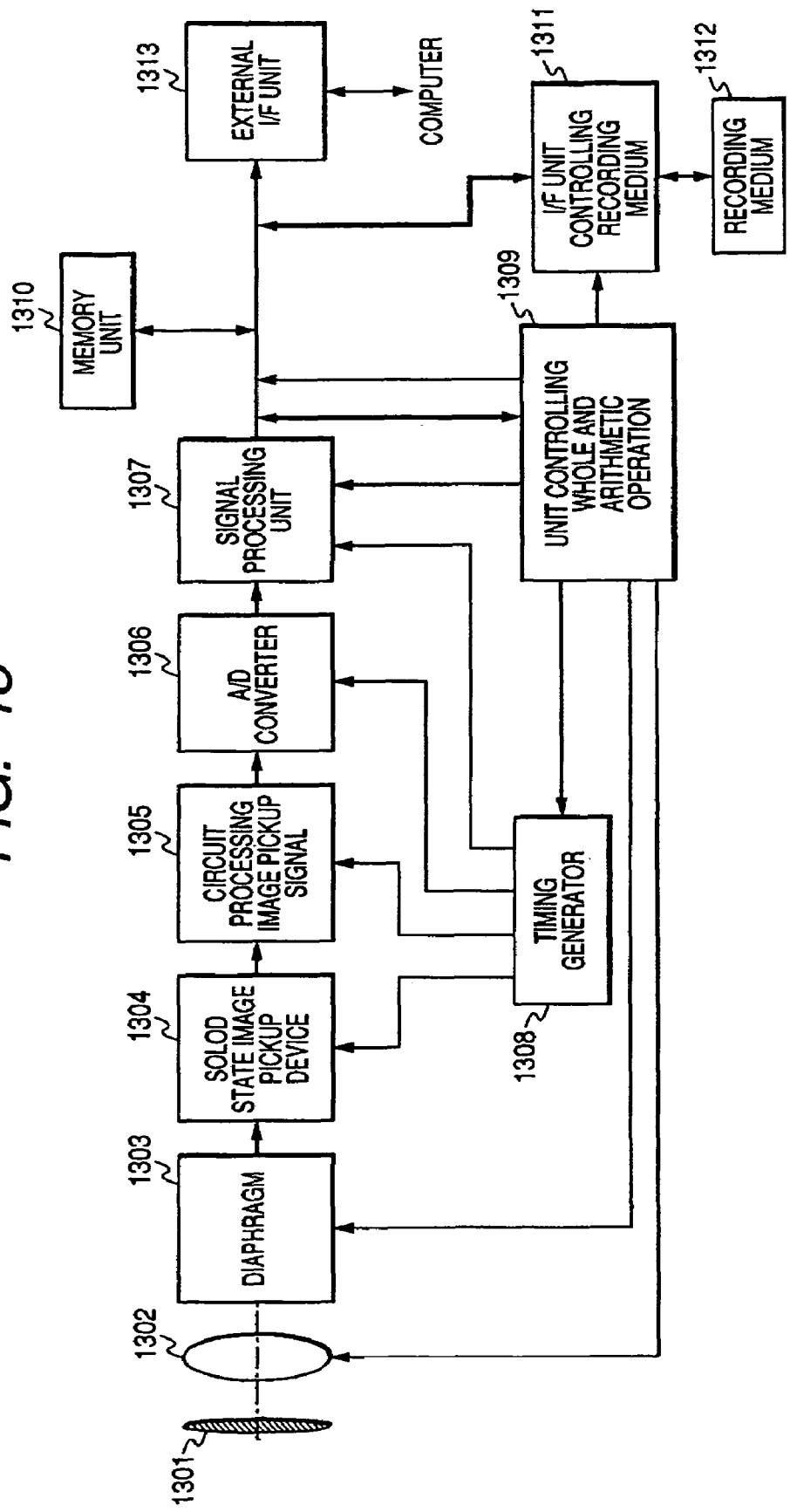
FIG. 13 shows another embodiment of the invention and is a block diagram showing an example of a construction of a still video camera.

FIG. 13 is a block diagram showing the case where the solid state image pickup device of each of the foregoing embodiments is applied to a "still video camera".

In FIG. 13, reference numeral 1301 denotes a barrier serving as both of a device for lens protection and a main switch; 1302 a lens to form an optical image of an object onto a solid state image pickup device 1304; 1303 a diaphragm to vary an amount of light passing through the lens 1302; 1304 the solid state image pickup device to fetch the object image formed by the lens 1302 as an image signal; and 1306 an A/D converter to convert the analog image signal outputted from the solid state image pickup device 1304 into a digital signal.

Reference numeral 1307 denotes a signal processing unit to make various kinds of correction to the image data outputted from the A/D converter 1306 and compressing the data; 1308 a timing generator to generate various timing signals to the solid state image pickup device 1304, an image pickup signal processing circuit 1305, the A/D converter 1306, and signal processing unit 1307; 1309 a whole control and arithmetic operation unit for executing various arithmetic operations and controlling the whole still video camera; 1310 a memory unit to temporarily store the image data; 1311 an interface (I/F) unit to record or read out the image data into/from a recording medium; 1312 a detachable recording medium such as a semiconductor memory or the like for recording or reading out the image data; and 1313 an interface unit to communicate with an external computer or the like.

The operation of the still video camera upon photographing in the foregoing construction will now be described.

When the barrier 1301 is opened, a main power source is turned on, a power source of a control system is subsequently turned on, and a power source of image pickup system circuits such as an A/D converter 1306 and the like is turned on.

To control an exposure amount, subsequently, the whole control and arithmetic operation unit 1309 opens the diaphragm 1303. The signal outputted from the solid state image pickup device 1304 is converted by the A/D converter 1306 and, thereafter, inputted to the signal processing unit 1307.

The arithmetic operation of an exposure is executed by the whole control and arithmetic operation unit 1309 on the basis of the processed data.

Brightness is discriminated on the basis of a photometric result. The whole control and arithmetic operation unit 1309 controls the diaphragm 1303 on the basis of the obtained brightness.

On the basis of the signal outputted from the solid state image pickup device 1304, high frequency components are extracted and the arithmetic operation of a distance to the object is executed by the whole control and arithmetic operation unit 1309. After that, the lens is driven and whether or not the object image has been in-focused is discriminated. If it is decided that the object image is out-of focused, the lens is driven and the distance is measured again. After the in-focused state is confirmed, the main exposure is started.

After the exposure, the image signal outputted from the solid state image pickup device 1304 is A/D converted by the A/D converter 1306. The digital signal is transmitted through the signal processing unit 1307 and written into the memory unit by the whole control and arithmetic operation unit 1309.

After that, the data stored in the memory unit 1310 passes through the recording medium control I/F unit 1311 and recorded into the detachable recording medium 1312 by the whole control and arithmetic operation unit 1309. It is also possible to transmit the data through the external I/F unit 1313, directly input it to a computer or the like, and modify the image.

An embodiment in the case where the solid state image pickup device of each of the foregoing embodiments is applied to a video camera will now be described in detail with reference to FIG. 14.

Figure 14:
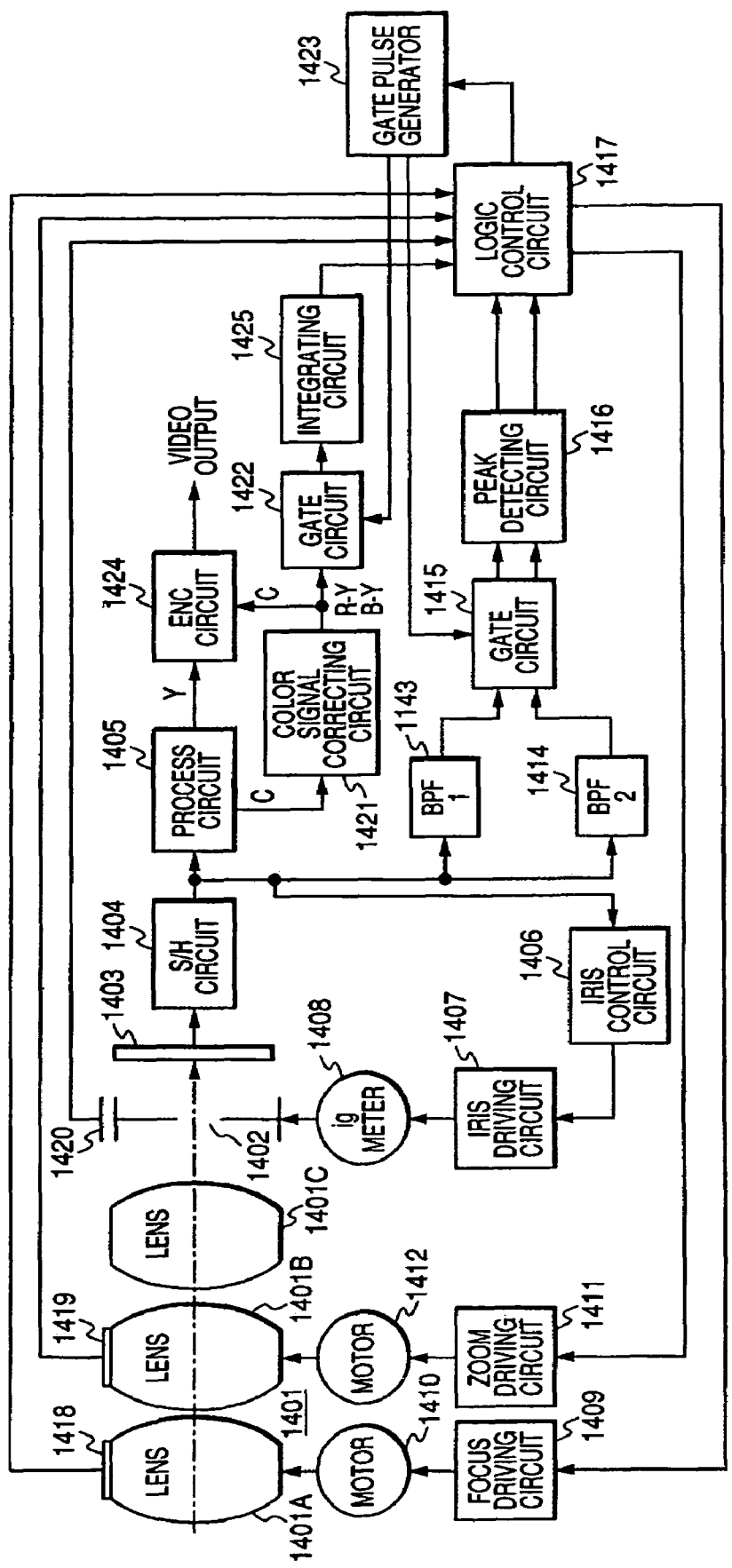
FIG. 14 shows another embodiment of the invention and is a block diagram showing an example of a construction of a video camera.

FIG. 14 is a block diagram showing the case where the solid state image pickup device of each of the foregoing embodiments is applied to a "video camera". In FIG. 14, reference numeral 1401 denotes a photographing lens comprising: a focusing lens 1401A to adjust a focal point; a zoom lens 1401B to execute the zooming operation; and an image pickup lens 1401C.

Reference numeral 1402 denotes a diaphragm; 1403 a solid state image pickup device to photoelectrically convert the object image formed on the image pickup surface into an electric image pickup signal; and 1404 a sample and hold (S/H) circuit to sample and hold the image pickup signal outputted from the solid state image pickup device 1403, further, amplify a level of the signal, and output a video signal.

Reference numeral 1405 denotes a process circuit to execute predetermined processes such as gamma correction, color separation, blanking process, and the like to the video signal outputted from the S/H circuit 1404 and output a luminance signal Y and a chroma signal C. The chroma signal C outputted from the process circuit 1405 is subjected to correction of a white balance and a color balance by a color signal correcting circuit 1421, so that color difference signals R−Y and B−Y are outputted.

The luminance signal Y outputted from the process circuit 1405 and the color difference signals R−Y and B−Y outputted from the color signal correcting circuit 1421 are modulated by an encoder circuit (ENC circuit) 1424 and outputted as a standard television signal. The standard TV signal is supplied to a video recorder (not shown) or an electronic view finder (not shown) such as a monitor EVF (Electric View Finder) or the like.

Reference numeral 1406 denotes an iris control circuit to control an iris driving circuit 1407 on the basis of the video signal which is supplied from the S/H circuit 1404 and automatically control an ig meter 1408 so as to control an aperture amount of the diaphragm 1402 so that the video signal is set to a predetermined level value.

Reference numerals 1413 and 1414 denote band pass filters (BPFS) having different band restriction frequencies for extracting high frequency components necessary for detection of a focal point from the video signal outputted from the S/H circuit 1404. Signals outputted from the first band pass filter 1413 (BPF1) and the second band pass filter 1414 (BPF2) are gated by a gate circuit 1415 and a focusing gate frame signal. A peak value of each signal is detected by a peak detecting circuit 1416, held, and inputted to a logic control circuit 1417.

An output signal of the logic control circuit 1417 is called a focal voltage. The object image is in-focused on the basis of the focal voltage.

Reference numeral 1418 denotes a focusing encoder to detect a moving position of the focusing lens 1401A; 1419 a zoom encoder to detect a focal distance of the zoom lens 1401B; and 1420 an iris encoder to detect an aperture amount of the diaphragm 1402. Detection values of those encoders are supplied to the logic control circuit 1417 to make system control.

The logic control circuit 1417 performs the focal detection for the object on the basis of the video signal corresponding to an area in the set focal detection region, thereby making focal adjustment. That is, the logic control circuit 1417 receives peak value information of the high frequency components supplied from the BPFs 1413 and 1414 and supplies control signals regarding a rotating direction, a rotational speed, rotation/stop, and the like of a focusing motor 1410 to a focus driving circuit 1409 so as to drive the focusing lens 1401A to a position where the peak value of the high frequency components becomes maximum, the focus driving circuit 1409, thereby controlling it.

It is to be noted that an image may be produced based on only the carrier overflowed into the storage capacitor or the floating diffusion region.

Each of the foregoing embodiments has been shown as specific examples of realizing the invention and the technical scope of the invention must not be limitatively interpreted by them.

This application claims priority from Japanese Patent Application No. 2005-008181 filed on Jan. 14, 2005, which is hereby incorporated by reference herein.

What is claimed is:

1. An image pickup device including a plurality of pixels each comprising:
    a floating diffusion region;
    a photoelectric conversion unit;
    a first transfer transistor for transferring carriers accumulated in said photoelectric conversion unit into said floating diffusion region;
    a capacitor in which at least a part of the carriers which have overflowed from said photoelectric conversion unit can flow; and
    a second transfer transistor, arranged in parallel to the first transfer transistor, for transferring the carriers in said capacitor into the floating diffusion region, through a path separate from a path through which the carriers are transferred from said photoelectric conversion unit into the floating diffusion region,
    wherein a potential barrier between said photoelectric conversion unit and said capacitor is lower than that between said photoelectric conversion unit and a photoelectric conversion unit of a neighboring pixel adjacent to said photoelectric conversion unit.

2. The device according to claim 1, further comprising a pixel signal generation unit generating pixel signal based on the carriers accumulated in the photoelectric conversion unit and that accumulated in the capacitor.

3. The device according to claim 1, further comprising a floating diffusion region into which the carriers accumulated in said photoelectric conversion unit transferred said first transfer transistor and an amplifying unit for amplifying a signal based on the carriers transferred to said floating diffusion region.

4. The device according to claim 3, further comprising a second transfer transistor for transferring the carriers accumulated in said capacitor to said floating diffusion region, wherein said capacitor is disposed in opposition to said floating diffusion region so as to sandwich said second transfer transistor and disposed in opposition to said photoelectric conversion unit so as to sandwich the region of said low potential barrier.

5. The device according to claim 1, wherein said photoelectric conversion unit includes a first semiconductor region of a first conductivity type for accumulating carriers and a second semiconductor region of a second conductivity type opposite to said first conductivity type, and a third semiconductor region of the second conductivity type is disposed between said photoelectric conversion unit and the photoelectric conversion unit of the pixel adjacent to said photoelectric conversion unit as potential barrier for the carriers.

6. The device according to claim 5, wherein a fourth semiconductor region of the second conductivity type whose concentration is lower than that of said third semiconductor region is formed between said photoelectric conversion unit and said capacitor.

7. The device according to claim 5, wherein a fourth semiconductor region of the second conductivity type different from said third semiconductor region is formed between said photoelectric conversion unit and the photoelectric conversion unit adjacent to said photoelectric conversion unit.

8. The device according to claim 5, wherein said third semiconductor region is disposed between said photoelectric conversion unit and the photoelectric conversion unit adjacent to said photoelectric conversion unit and between said photoelectric conversion unit and said capacitor.

9. The device according to claim 5, wherein a fourth semiconductor region of the second conductivity type different from said third semiconductor region is formed below said capacitor.

10. The device according to claim 1, wherein said pixel includes a reset transistor for setting an electric potential of an input of said amplifying unit.

11. An image pickup device according to claim 1, wherein the image pickup device is incorporated in a camera that includes:

a lens for forming an optical image onto said solid state image pickup device; and a diaphragm for making an amount of light passing though said lens variable.

* * * * *